United States Patent
Yamada et al.

(10) Patent No.: US 8,964,803 B2
(45) Date of Patent: Feb. 24, 2015

(54) WAVELENGTH SWEEPING LIGHT SOURCE AND IMAGING APPARATUS USING THE SAME

(75) Inventors: Tomohiro Yamada, Yokohama (JP); Kentaro Furusawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 543 days.

(21) Appl. No.: 13/154,127

(22) Filed: Jun. 6, 2011

(65) Prior Publication Data

US 2011/0304853 A1 Dec. 15, 2011

(30) Foreign Application Priority Data

Jun. 10, 2010 (JP) .................................. 2010-133293

(51) Int. Cl.
*H01S 3/10* (2006.01)
*G01B 9/02* (2006.01)
(Continued)

(52) U.S. Cl.
CPC .......... *G01B 9/02007* (2013.01); *H01S 5/0656* (2013.01); *H01S 5/14* (2013.01); *G01B 9/02004* (2013.01); *G01B 9/02027* (2013.01); *G01B 9/02091* (2013.01); *H01S 3/08013* (2013.01); *H01S 3/083* (2013.01); *H01S 3/10046* (2013.01); *H01S 5/0085* (2013.01); *H01S 5/0657* (2013.01); *H01S 5/06835* (2013.01); *H01S 5/4012* (2013.01); *H01S 5/4087* (2013.01)
USPC ................... 372/23; 372/24; 372/70; 372/94; 372/97

(58) Field of Classification Search
USPC ......................................... 372/23
See application file for complete search history.

(56) References Cited

U.S. PATENT DOCUMENTS 5,524,118 A 6/1996 Kim et al.
7,443,903 B2 * 10/2008 Leonardo et al. ............... 372/97
(Continued)

FOREIGN PATENT DOCUMENTS

JP S57-027087 A 2/1982
JP 08-162697 A 6/1996
(Continued)

OTHER PUBLICATIONS

Yamashita et al., "Wide and Fast Wavelength-Tunable Mode-Locked Fiber Laser Based on Dispersion Tuning", Optics Express, (2006), pp. 9299-9305, vol. 14, No. 20.
(Continued)

*Primary Examiner* — Xinning Niu
(74) *Attorney, Agent, or Firm* — Canon USA Inc. IP Division

(57) ABSTRACT

A light source apparatus includes a laser oscillator equipped with a first optical resonator, a plurality of second optical resonators including input portions respectively connected in parallel to the first optical resonator, a plurality of light extraction units configured to extract a light beam from an output portion of each second optical resonator, and a light multiplexing unit configured to multiplex the light beam extracted from each light extraction unit, wherein the light source apparatus causes the light multiplexing unit to output a multiplexed light beam passed through the plurality of second optical resonators, an optical member having refractive index dispersion and an optical amplification medium are disposed in each of the plurality of second optical resonators, and the optical amplification media of the plurality of second optical resonators are different from each other in maximum gain wavelength.

17 Claims, 17 Drawing Sheets

(51) Int. Cl.
  *H01S 5/065* (2006.01)
  *H01S 5/14* (2006.01)
  *H01S 3/08* (2006.01)
  *H01S 3/083* (2006.01)
  *H01S 5/00* (2006.01)
  *H01S 5/0683* (2006.01)
  *H01S 5/40* (2006.01)

(56) References Cited

U.S. PATENT DOCUMENTS

2002/0044575 A1* 4/2002 May ................................ 372/20
2006/0182153 A1* 8/2006 Liu ................................... 372/6

FOREIGN PATENT DOCUMENTS

| JP | 08182697 A | 7/1996 |
| JP | 11224962 A | 8/1999 |
| JP | 2006-047264 A | 2/2006 |

OTHER PUBLICATIONS

Osamu Kusakar, et al., "Optically-Driven Fast and Widely Wavelength-Swept Fiber Laser Based on Dispersion Tuning", IEEE, 2010, 2 pages.

* cited by examiner

WAVELENGTH SWEEPING LIGHT SOURCE AND IMAGING APPARATUS USING THE SAME

BACKGROUND OF THE INVENTION

1. Field of the Invention

The present invention relates to a light source apparatus capable of changing an oscillation wavelength thereof and also relates to an imaging apparatus equipped with the light source apparatus.

2. Description of the Related Art

In the field of communication networks as well as in the field of inspection apparatuses, a light source apparatus capable of changing an oscillation wavelength is well known. Recent developments in these fields have raised the need to increase a wavelength sweep rate and widen a sweep band of the light source apparatus.

As an example of an inspection apparatus, there is an optical coherence tomography (OCT) apparatus configured to capture a tomographic image of an inspection target based on optical coherence. OCT is a non-invasive imaging technique, which can be widely practiced in the medical field because of its noninvasiveness. Recently, a new technique for OCT, known as swept source OCT (SS-OCT) has been actively investigated.

A swept source optical coherence tomography (SS-OCT) apparatus uses a wavelength sweep light source to obtain depth information based on spectral interference. SS-OCT is useful in that the loss of light quality is small because no spectroscope is required and an image having a signal-to-noise (S/N) ratio higher than in time domain OCT can be acquired.

In the SS-OCT apparatus, it is desired to increase the wavelength sweep rate because the time required to acquire an image can be reduced. Specifically, if the wavelength sweep rate is high, a vital observation can be made in a relatively short time, thereby reducing an influence of inevitable movement of the object under observation.

Further, it is desired to broaden the band because the spatial resolution of a tomographic image can be increased if the wavelength sweep band is wide.

In general, the following formula (1) can be used to represent the resolution of a tomographic image in the depth direction, in which $\Delta\lambda$ represents a wavelength sweep width and $\lambda 0$ represents an oscillation wavelength.

[Formula 1]

$$\frac{2\ln 2}{\pi} \times \frac{\lambda_0^2}{\Delta\lambda} \qquad \text{Formula (1)}$$

Accordingly, increasing the wavelength sweep width $\Delta\lambda$ is useful to increase the resolution in the depth direction.

A light source usable for an SS-OCT apparatus is discussed in non-patent literature (NPL) document entitled "Wide and fast wavelength-tunable mode-locked fiber laser based on dispersion tuning", by S. Yamashita, et al. Opt. Exp. Vol. 14, pp. 9299-9305 (2006) (hereinafter, referred to as "NPL 1"). As described in NPL 1, the conventional light source usable for the SS-OCT apparatus performs dispersion tuning for realizing a wavelength variation (sweeping) based on wavelength dispersion (hereinafter, simply referred to as "dispersion") of the refractive index of a material in a resonator. The resonator uses a semiconductor optical amplifier (SOA) that has been studied at a band to be chiefly used in the communication field.

The above-described dispersion tuning includes controlling the oscillation wavelength in an active mode locking state because a free spectral range (hereinafter referred to as "FSR") of the resonator has wavelength dependence. More specifically, the dispersion tuning includes performing a wavelength sweeping operation by changing the frequency of a modulation signal that causes the active mode locking. Therefore, a high-speed wavelength sweeping operation can be realized by quickly changing the frequency of the modulation signal.

In this case, the free spectral range indicates the frequency interval of a resonator mode relative to the light circulating in the resonator. The free spectral range (FSR) can be defined by the following formula (2), in which c represents the speed of light in the vacuum, n represents a refractive index of the resonator, and L represents a resonator length.

[Formula 2]

$$FSR = \frac{c}{nL} \qquad \text{Formula (2)}$$

Further, as discussed in NPL 1, the wavelength sweep range $\Delta\lambda$ according to the dispersion tuning can be defined by the following formula.

[Formula 3]

$$\Delta\lambda = \frac{n}{cDN} \qquad \text{Formula (3)}$$

where N is a positive integer indicative of the order of harmonic mode locking, and D is the dispersion parameter in the resonator.

According to the dispersion tuning based on the active mode locking discussed in NPL 1, the wavelength sweep rate can be increased by quickly changing the frequency of the modulation signal. However, the wavelength sweep range is dependent on the semiconductor optical amplifier (SOA) that constitutes the resonator. Therefore, the sweep range is limited by the wavelength dispersion in the resonator cannot be sufficiently broadened.

On the other hand, the U.S. patent application Ser. No. 7,443,903 (hereinafter, referred to as patent literature "PTL 1"), there is a conventional laser apparatus configured to synchronously irradiate a plurality of positions with laser light. According to PTL 1, light emitted from one master laser can be guided to a plurality of amplifiers in such a way as to synchronously control a plurality of output heads.

The laser apparatus discussed in PTL 1 can output synchronized light beams from the plurality of output heads via a plurality of amplifiers coupled with the same master laser. However, the laser apparatus discussed in PTL 1 does not perform any operation for sweeping the wavelength of the output light.

SUMMARY OF THE INVENTION

The present invention relates to a light source apparatus that can realize a high-speed and broad-band wavelength sweeping operation.

According to an aspect of the present invention, a light source apparatus includes a laser oscillator equipped with a first optical resonator, a plurality of second optical resonators including input portions respectively connected in parallel to the first optical resonator, a plurality of light extraction units configured to extract a light beam from an output portion of each second optical resonator, and a light multiplexing unit configured to multiplex the light beam extracted from each light extraction unit, wherein the light source apparatus causes the light multiplexing unit to output a multiplexed light beam passed through the plurality of second optical resonators, an optical member having refractive index dispersion and an optical amplification medium are disposed in each of the plurality of second optical resonators, and the optical amplification media of the plurality of second optical resonators are different from each other in maximum gain wavelength.

The light source apparatus according to the present invention includes a plurality of second optical resonators connected in parallel to the laser oscillator equipped with the first optical resonator. Both the optical member having refractive index dispersion and the optical amplification member are provided in each second optical resonator. The light multiplexing unit multiplexes a plurality of light beams extracted from the plurality of second optical resonators and outputs a multiplexed light beam. The optical amplification media of respective second optical resonators are different from each other in maximum gain wavelength. Multiplexing the plurality of light beams extracted from the plurality of second optical resonators and outputting a multiplexed light beam can realize a broad-band wavelength sweeping operation. Further, using the optical member having refractive index dispersion can realize a high-speed wavelength sweeping operation based on the dispersion tuning.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the invention will be described in detail below with reference to the drawings.

Figure 1:
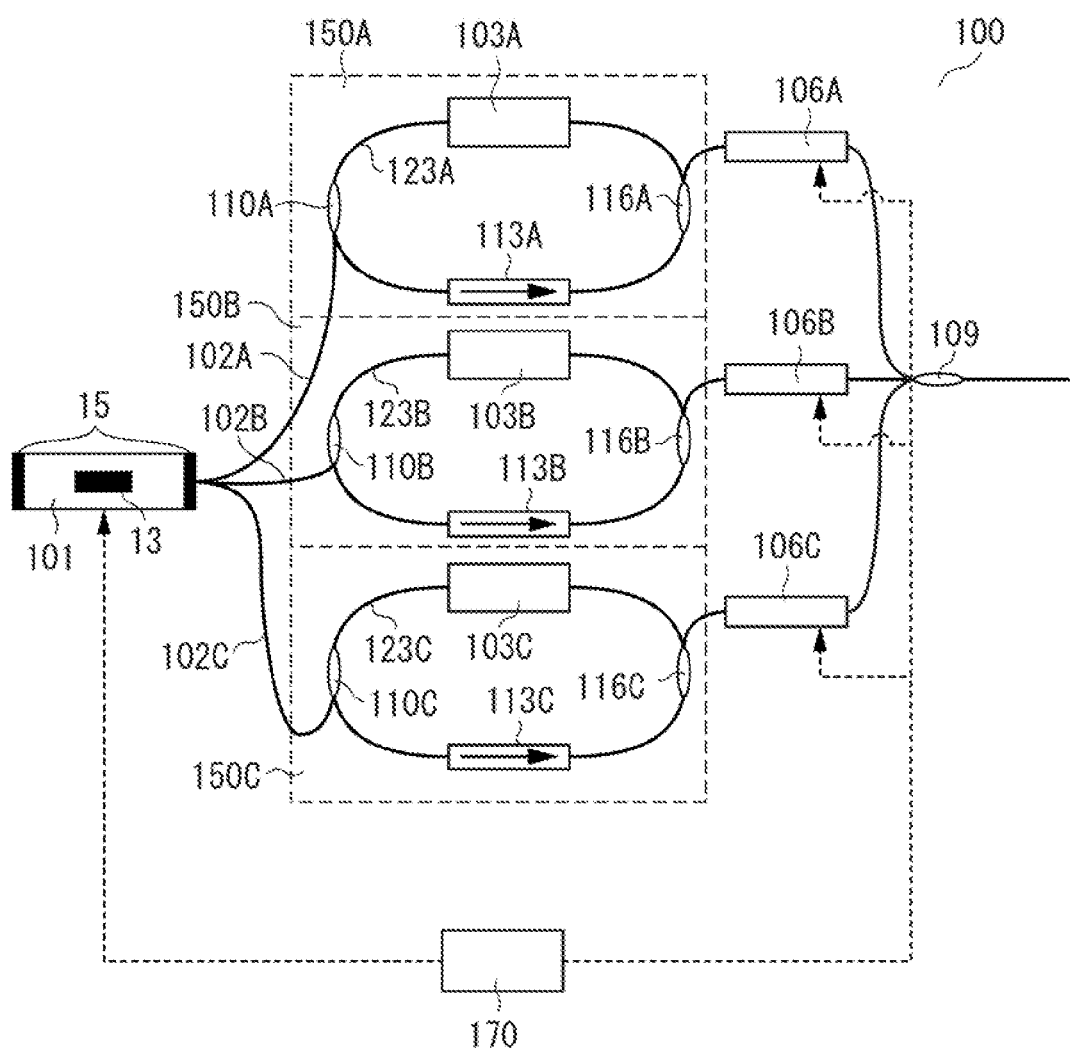
FIG. 1 illustrates a schematic example according to an exemplary embodiment of the present invention.

FIG. 1 illustrates a schematic example of a light source apparatus according to the present invention.

A light source apparatus 100 illustrated in FIG. 1 includes a laser oscillator 101 equipped with a first optical resonator 15, and a plurality of second optical resonators 150A, 150B, and 150C respectively having input portions 110A, 110B, and 110C connected in parallel to the first optical resonator 15. The light source apparatus 100 further includes light extraction units 106A, 106B, and 106C that can extract light beams from output portions 116A, 116B, and 116C of respective second optical resonators 150A, 150B, and 150C, and a light multiplexing unit 109 that can multiplex a plurality of light beams extracted from the light extraction units 106A, 106B, and 106C.

The laser oscillator 101 includes an optical amplification medium 13 that is disposed between a pair of mirrors of the first optical resonator 15 and capable of amplifying light. One end of the first optical resonator 15 that serves as a light emission surface is connected to the input portions 110A, 110B, and 110C of the second optical resonators 150A, 150B, and 150C via a plurality of optical waveguides 102A, 102B, and 102C.

The second optical resonators 150A, 150B, and 150C include optical waveguides 123A, 123B, and 123C each serving as an optical member having refractive index dispersion, optical amplification media 103A, 103B, and 103C, and optical isolators 113A, 113B, and 113C that can be selectively provided, respectively.

The input portions 110A, 110B, and 110C of the second optical resonators 150A, 150B, and 150O respectively are constituted by input couplers. The output portions 116A, 116B, and 116C of the second optical resonators 150A, 150B, and 150C respectively are constituted by output couplers. These input/output couplers and the optical waveguides 123A, 123B, and 123C are optically coupled with each other to constitute ring resonators.

Each optical isolator circulates the light in each ring resonator in one direction as to suppress a spatial distribution of the gain that may be generated by a standing wave residing in each optical amplification medium.

In the present exemplary embodiment, an example of the optical amplification medium (103A, 103B, and 103C) is a current-driven semiconductor optical amplifier (SOA).

Basically, the SOA has a structure similar to that of a semiconductor laser and is operable not only as a light source but also as an optical amplification medium. The structure of the SOA is different from that of the semiconductor laser in that no resonator structure is employed and reflections on an end surface thereof can be suppressed.

The light source apparatus illustrated in FIG. 1 includes a plurality of resonators 150A, 150B, and 150C that are disposed in parallel with each other and connected to the laser oscillator 101.

When light generated by the laser oscillator 101 is guided into a plurality of optical amplification media that respectively constitute the second optical resonators, the gain of the optical amplification medium in each of the plurality of resonators changes and mode-locking occurs due to periodic gain variations in the plurality of resonators. In view of the foregoing, the laser oscillator 101 can be regarded as a master laser; and each of the plurality of resonators 150A, 150B, and 150C can be regarded as a slave laser. Therefore, the following description uses the terminologies "master" and "slave" to express a relationship between respective lasers.

Figure 2:
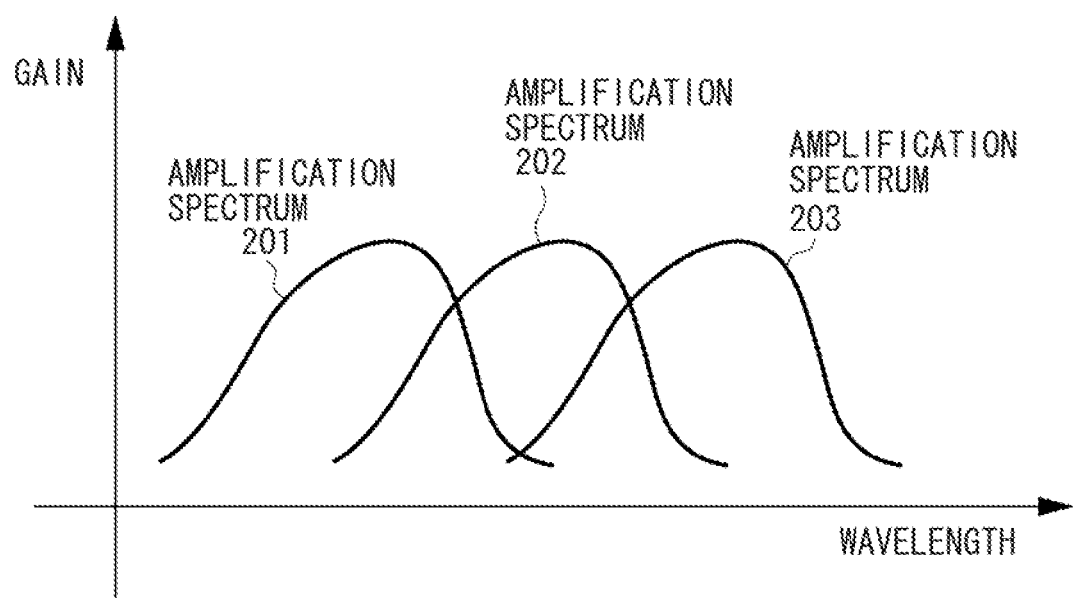
FIG. 2 is a graph illustrating example characteristics of optical amplifiers applicable to an apparatus according to the present invention.

In the light source apparatus according to the present embodiment, it is desired that a plurality of optical amplification media constituting the second optical resonators are different in maximum gain wavelength (gain spectrum peak wavelength) and their gain bands (gain spectra) are partly overlapped with each other, as illustrated in FIG. 2.

In this manner, when each row of light beams output from a plurality of slaves has a different band and a plurality of bands are partly overlapped with each other, a broad-band wavelength sweeping range can be obtained in total. Further, a large band not oscillating is not present in the wavelength sweep band.

A laser light source capable of causing pulse oscillations is employable as the laser oscillator 101. For example, the above-described laser is a semiconductor laser or a mode-locking laser that can perform a gain switching operation.

In the light source apparatus according to the present invention, a pulse generated by the laser oscillator 101 equipped with the first resonator is guided into the plurality of second optical resonators and causes cross gain modulation in the optical amplification media constituting the second optical resonators.

Thus, the mode-locking due to the dispersion tuning occurs in each of the plurality of second optical resonators. Each resonator can generate a light beam that is differentiated in wavelength (oscillation frequency) according to a modulation signal. The light beams having different wavelengths generated by the plurality of second optical resonators are extracted by the light extraction units 106A, 106B, and 106C respectively and can be multiplexed and emitted by the light multiplexing unit 109.

In the light source apparatus according to the present invention, the plurality of second optical resonators are differentiated in the wavelength sweep band. Therefore, the light source apparatus according to the present invention can realize a broad-band and high-speed wavelength sweeping operation by multiplexing the light beams extracted from the plurality of second optical resonators to emit the multiplexed light beam and further changing the oscillation wavelength based on the dispersion tuning according to a modulation signal.

In the light source apparatus according to the present invention, it is desired that the oscillation wavelength of the laser oscillator (master laser) is equal to or shorter than wavelengths within the amplification band of each optical amplification medium constituting the plurality of second optical resonators (slave lasers). When the above-described condition is satisfied, a light pulse generated by the master laser can cause the cross gain modulation in the optical amplification medium in each slave laser.

Each of the optical amplification media which constitute the plurality of second optical resonators 150A, 150B, and 150C (slave lasers) can be driven by a direct-current (DC) power source. If the pulsed light is emitted from the master laser, the gain of the optical amplification medium decreases due to consumption by the light pulse. In other words, the light pulse from the master laser can modulate the gain of each slave laser.

Hereinafter, in below described mode locking oscillations, it is required to realize longitudinal multimode oscillations by causing any modulation in the resonator. As an example modulation method, the present invention uses gain modulation in a slave resonator based on the light pulse from the master laser.

Hereinafter, an example laser active mode locking operation and an example dispersion tuning operation are described below.

The active mode locking oscillation can be referred to as an operation of the laser that causes a high-frequency pulse oscillating operation in a longitudinal multimode oscillation wherein a plurality of resonator modes are simultaneously excited and the phase relationship between these is constant.

To fix the longitudinal multimode oscillation and the phase relationship between the modes, it is typically useful to configure a laser optical system to possess nonlinearity and include an appropriate optical modulator.

For example, in a case where the optical modulator is a transmittance amplitude control optical modulator, it is feasible to excite sidebands at both a low-frequency side and a high-frequency side of the resonator mode that has been first excited by causing the optical modulator to change the transmittance to a high-frequency side.

When $\omega'$ represents the frequency applied by the optical modulator and $\omega 0$ represents the frequency of the first excited resonator mode, the sideband can be excited to have the frequency of $\omega 0 \pm \omega'$.

If the frequency $\omega'$ is equal to a resonator mode interval or its integral multiple, the sideband excites a resonator mode adjacent to the frequency $\omega 0$. As described above, the resonator modes are mutually excited via the sideband and the longitudinal multimode oscillation can be realized.

Further, when the resonator is configured to possess nonlinearity due to the provision of an optical amplifier or a nonlinear medium, or the presence of the optical modulator itself, an interaction between the modes is caused and the phase relationship between the modes can be defined. As a result, the laser can cause oscillations and output a pulse train.

Giving a modulation to the resonator from an external side to forcibly generate a mode locking state, as described above, is referred to as the active mode locking. In the present invention, a light pulse from the master laser outside of the resonator is supplied into an optical amplifier in the resonator. The mode locking can be realized by modulating the gain of each slave resonator.

In a laser apparatus including a plurality of slaves resonators, when the gain of each slave resonator is independently (electrically) controlled, it is not easy to equalize a light pulse generation rate in each slave and further accurately synchronize other operation. Especially, if the modulation frequency is in a range of several GHz band, the above-described phenomenon is remarkable.

Hence, the apparatus according to the present invention supplies branched light pulses in a parallel fashion to a plurality of slaves in such a way as to synchronize respective slaves (i.e., the plurality of second optical resonators).

If the above-described method is employed, the frequency of an input pulse can be principally equalized with a driving frequency of each slave. Therefore, in all slaves, the light pulse generation rate becomes the same value and the wavelength sweeping operation can be performed at the same timing and the same speed.

Regarding the frequency of the mode locking, for example, if the length of the plurality of second optical resonators (each slave) is 200 m and the refractive index is approximately 1.5, the cavity length of each slave resonator is about 300 m. The light propagating throughout the slave resonator circulates the cavity at the rate of approximately 1 MHz.

Accordingly, the resonator mode interval (free spectral range (FSR)) of the resonator is equal to approximately 1 MHz.

Hence, the mode locking can be realized by setting the driving frequency of the optical modulator to 1 MHz or its integral multiple. In this state, a pulse train having a repetition frequency of an integral multiple of 1 MHz can be generated. In practice, to stabilize the mode locking operation, it is desired that the driving frequency of the optical modulator is 100 to 1000 times the repetition frequency. Accordingly, the modulation for the mode locking is performed in a range from 100 MHz to 1 GHz.

Next, the dispersion tuning is described below.

The dispersion tuning is an operation method for changing the oscillation wavelength of an active mode locking laser using the fact that if the refractive index of a laser resonator that causes the above-described mode locking has wavelength dependence, the FSR of the resonator has wavelength dependence correspondingly.

As described above, the active mode locking can be realized by causing a modulation of the FSR or its integral multiple of the optical resonator in an oscillation frequency band. However, the FSR has wavelength dependence in the dispersion tuning. Therefore, the dispersion tuning has a principle to change the oscillation wavelength of the mode locking by changing the modulation frequency.

More specifically, in order to obtain the active mode locking in respective slaves, the apparatus according to the present invention changes the repetition frequency of a light pulse supplied from the master laser. In this case, the repetition frequency can be referred to as a frequency to be set to introduce the light pulse into each slave. As a result, the period of the gain modulation changes in the optical amplifier of each slave. Thus, the oscillation wavelength changes in the mode locking state.

An example situation to be considered in the present exemplary embodiment is that one master laser simultaneously supplies pulses to a plurality of slaves (i.e., the second optical resonators) to enable respective slaves to cause mode locking oscillation.

In a case where the group refractive index of the optical waveguide in each slave has wavelength dependence, each slave causes the active mode locking by a pulse from the master laser as described above. If the frequency of pulses injected from the master laser is changed, the central frequency of a light pulse extracted from each slave changes in each slave correspondingly.

In this case, if a repetition frequency f0 of pulses injected from the master laser is changed, namely when the modulation frequency for the active mode locking is changed, all slaves are required to have the same active mode locking frequency so that the active mode locking occurs at the same frequency f0 in all of the slaves.

To this end, it is required that all slaves have the same FSR. More specifically, when n(v) represents a refractive index of the resonator that constitutes each slave and L represents a resonator length, respective slaves are required to have a same value with respect to the FSR defined by the following formula (4).

[Formula 4]

$$FSR(v) = \frac{c}{n(v) \times L} \quad \text{Formula (4)}$$

It is desired that an amount of wavelength change of a light pulse generated relative to a change of the repetition frequency f0, i.e., a change amount of the central frequency of the light, is uniform in all slaves. If the above-described condition is satisfied, each slave can generate a light pulse train having the same wavelength sweep rate. When the above-described condition is satisfied, the light source can be preferably used for an OCT apparatus.

To this end, it is required that the frequency dependency of the free spectral range (FSR), which can be defined by the following formula (5), has the same value in respective slaves.

[Formula 5]

$$\frac{dFSR(v)}{dv} = \left( \frac{d\left(\frac{c}{n(v) \times L}\right)}{dv} \right) \quad \text{Formula (5)}$$

Further, it is desired to improve a method for extracting pulses from respective slaves and multiplexing the extracted pulses to cause the light source apparatus according to the present invention to effectively generate a light pulse train using light pulses from all slaves in such away that the oscillation wavelength is swept with elapsed time.

The following embodiments are employable as the above-described light source apparatus.

<1. An Embodiment Configured to Cause the Active Mode Locking in Only One of the Second Optical Resonators (Slaves)>

The master laser supplies a light pulse having the repetition frequency f0 to each slave.

In the dispersion tuning, the following formulas (6) and (7) can be obtained by performing Taylor expansion in the vicinity of $\lambda = \lambda_0$. In formula (7) D represents a dispersion parameter of the resonator, and c represents the speed of light. In formulas (6) and (7), n represents a refractive index at wavelength $\lambda$ in the resonator.

[Formula 6]

$$n(\lambda) = n(\lambda_0) + \frac{dn(\lambda)}{d\lambda}\bigg|_{\lambda=\lambda_0} \times \frac{1}{2!}(\lambda - \lambda_0) + \frac{d^2n(\lambda)}{d\lambda^2}\bigg|_{\lambda=\lambda_0} \times \frac{1}{3!}(\lambda - \lambda_0)^2 + \ldots \quad \text{Formula (6)}$$

In the formula (6), the first term (i.e., the refractive index at the resonant wavelength λ0) can be rewritten in the following manner.

$$n_0 = n(\lambda_0)$$

Further, in formula (7), fm represents the frequency of a light pulse to be supplied to a slave, and a relationship fm0=N*FSR is satisfied, in which N represents the order of the mode locking.

Using the above-described parameters, the oscillation wavelength of the slave in a dispersion mode locking operation can be defined by the following formula (7).

[Formula 7]

$$\lambda_m = -\frac{n_0^2 L}{c^2 ND}(f_m - f_{m0}) + \lambda_0 \quad \text{Formula (7)}$$

In the formula (7), L represents a resonator length of the slave.

Further, in a slave, the active mode locking oscillation can occur at the wavelength λm. However, to actually cause oscillations, it is required that the wavelength λm is within the wavelength band Δλ of an optical amplification medium.

Accordingly, to enable only a target slave to cause oscillations and prevent the remaining slaves from causing oscillations, it is desired that the wavelength λm is present within the gain band of the target slave and the wavelength λm is out of the gain band of the remaining slaves, relative to the repetition frequency fm of the master laser.

To this end, it is required to appropriately set the parameters in the formula (7).

Performing the above-described parameter setting can constantly realize a state in which only one of a plurality of slaves is oscillating.

Further, for the purpose of facilitating the design of a light source apparatus, it is desired that the wavelength sweep range is uniformly allocated to each slave, or an amplification wavelength band of the optical amplification medium in each slave is the same.

A wavelength interval Δλm between an N-th mode and an (N+1)-th mode can be defined by the following formula (8).

[Formula 8]

$$\Delta\lambda_m = \frac{n_0}{cND} \quad \text{Formula (8)}$$

Accordingly, if M represents the number of the slaves, it is useful to set the above-described Δλm to be M times the wavelength sweep range allocated to each slave or the amplification wavelength band of the optical amplification medium to cause the active mode locking in only one slave at the oscillation frequency fm.

<2. An Embodiment Configured to Simultaneously Cause the Active Mode Locking in Respective Slaves and Perform Thinning at a Gate>

The master laser supplies a light pulse to each slave laser at the pulse repetition frequency f0. In the present exemplary embodiment, the active mode locking occurs in each slave laser in this situation.

If the pulse repetition frequency f0 is changed in this state, the central frequency of a light pulse oscillating in each slave changes correspondingly. Accordingly, a wavelength swept light pulse can be extracted from each slave. For example, a light pulse having wavelengths ranging from λ11 to λ12 can be extracted from a slave 1, a light pulse having wavelengths ranging from λ21 to λ22 can be extracted from a slave 2, and a light pulse having wavelengths ranging from λ31 to λ32 can be extracted from a slave 3.

The light source apparatus according to the present exemplary embodiment performs multiplexing of the pulses extracted from respective slaves after using an appropriate gate mechanism. Thus, the multiplexed light pulse can be output as an appropriate wavelength swept pulse train which can be used by a light source for an SS-OCT apparatus.

Figure 3:
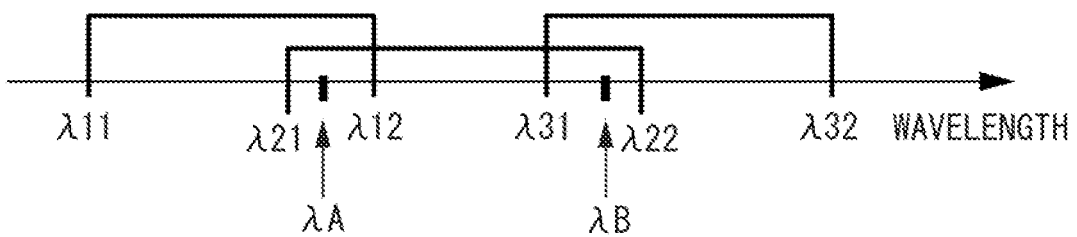
FIG. 3 illustrates a schematic example of wavelength sweep in an apparatus according to the present invention.

FIG. 3 illustrates the pulse wavelength relationship among the respective slaves. When the wavelengths λ11, λ12, λ21, λ22, λ31, and λ32 satisfy the relationship illustrated in FIG. 3, the wavelength sweeping operation is performed in the order of λ11, λA, λB, and λ32.

In the present exemplary embodiment, the gate 106A (i.e., the light extraction unit) connected to the slave laser 150A illustrated in FIG. 1 is controlled to be kept in an OPEN state when a light pulse having wavelengths ranging from λ11 to λA is extracted from the slave laser 150A. The gate 106A is kept in a CLOSE state in other situations.

Similarly, the gate 106B connected to the slave laser 150B is controlled to be kept in an OPEN state when a light pulse having wavelengths ranging from λA to λB is extracted from the slave laser 150B and is controlled to be kept in a CLOSE state in other situations. Similarly, the gate 106C connected to the slave laser 150C is controlled to be kept in an OPEN state when a light pulse having wavelengths ranging from λB to λ32 is extracted from the slave laser 150C and is controlled to be kept in a CLOSE state in other situations.

To realize the above-described operation, it is desired that a correspondence relationship between the frequency of a pulse emitted from the master laser and the central frequency of an oscillation pulse in each slave laser is known beforehand. In this case, for example, a light source control unit 170 can output a control signal to the master laser 101 to control the pulse repetition frequency f0 of the master laser 101. At the same time, the light source control unit 170 can send a control signal to the gate (106A to 106C) of each slave to bring the gate into the OPEN or CLOSE state.

The gate mechanism is, for example, an electro-optic modulator (EOM) that can perform a high-speed operation. Further, in a case where there is any time lag before the oscillation frequency of each slave starts changing in response to a change in the repetition frequency f0 of the pulse injected from the master laser, it is useful that the light source control unit 170 sends an appropriately delayed signal to each gate.

In the present exemplary embodiment, if the number of the slaves is three, for example, each of the above-described gates can be controlled to transmit the signal corresponding to only one among the three consecutive sweeping operations performed in respective slaves.

For example, it is useful to equalize the optical distance from each optical amplifier (103A to 103C) to the multiplexing coupler 109 and further equalize the optical distance from each gate (106A to 106C) to the multiplexing coupler 109.

In the present exemplary embodiment, when each slave (150A to 150C) performs a wavelength sweeping operation, each gate (106A to 106C) is controlled in the following manner. When the master laser performs a sweeping operation at the repetition frequency f0, only the gate 106A is kept in the OPEN state during the first sweeping operation, only the gate 106B is kept in the OPEN state during the second sweeping operation, and only the gate 106C is kept in the OPEN state during the third sweeping operation.

Accordingly, the light pulses from respective gates 106A, 106B, and 106C are multiplexed by the multiplexing coupler 109, and a light pulse train whose frequency is successively swept in the range from λ11 to λ32 is generated.

To realize the above-described operation, it is desired to employ the following arrangement considering a propagation path. More specifically, a change in the repetition frequency of the master laser 101 propagates to the optical amplifier of each slave. As a result, the oscillation wavelength of each slave changes and a light pulse having the changed oscillation wavelength propagates to the multiplexing coupler 109 via the output coupler.

In view of the foregoing, it is required that a sum of the optical path length from the master laser (i.e., the laser oscillator) to the optical amplification medium and the optical path length from the optical amplification medium to the multiplexing coupler 109 (i.e., the light multiplexing unit) takes a same value in each of the second optical resonators.

Figure 4:
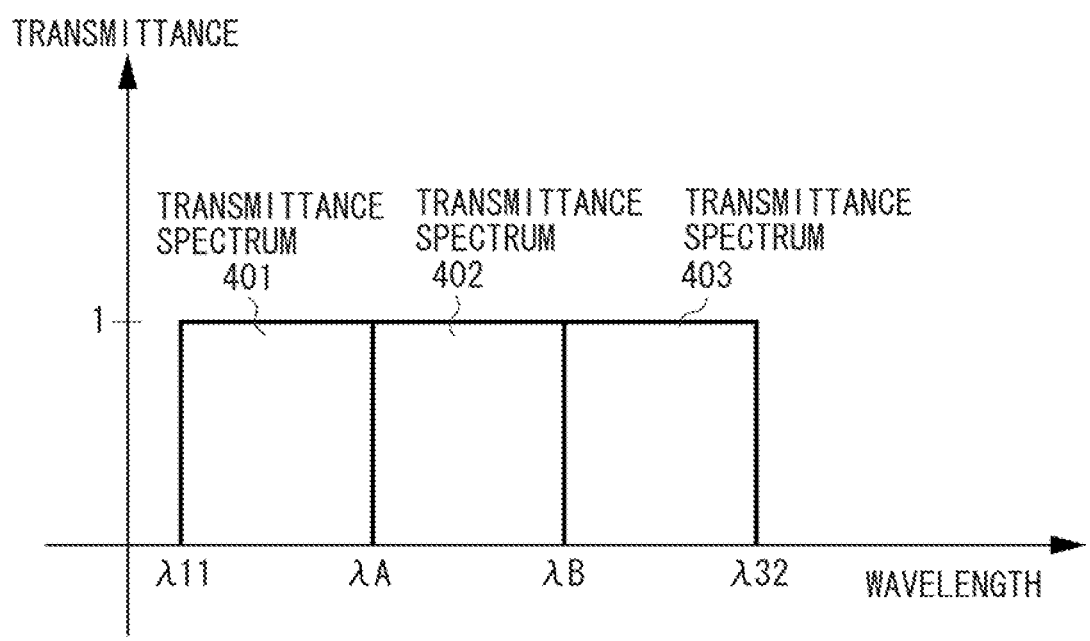
FIG. 4 is a graph illustrating example characteristics of light extraction units applicable to an apparatus according to the present invention.

Further, as illustrated in FIG. 4, a band-pass filter (transmittance spectrum 401) capable of transmitting a light pulse having wavelengths ranging from λ11 to λA can be used as the gate 106A. A band-pass filter (transmittance spectrum 402) capable of transmitting a light pulse having wavelengths ranging from λA to λB can be used as the gate 106B. A band-pass filter (transmittance spectrum 403) capable of transmitting a light pulse whose wavelength ranging λB to λ32 can be used as the gate 106C.

In this case, the band-pass filters connected to respective slaves can prevent the oscillation wavelengths of respective slaves from overlapping with each other. This is preferable in that the laser output can be stabilized and the noise can be suppressed.

<3. An Embodiment Configured to Divide a Pulse of Each Slave Laser Without Performing any Thinning Processing>

In addition to the above-described pulse thinning method, a method that uses an optical circuit to selectively deliver a light pulse to another optical waveguide by switching thereof can be employed.

Figure 5:
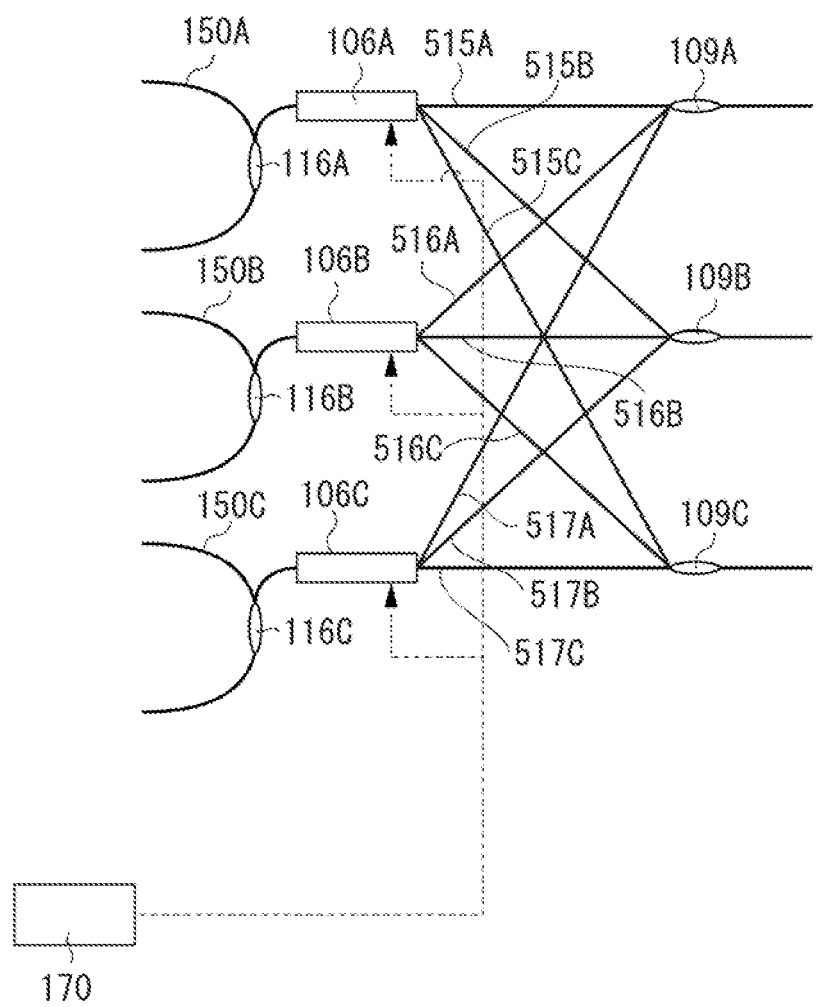
FIG. 5 illustrates a schematic example of an apparatus according to the present invention.

FIG. 5 illustrates an example of an optical apparatus that employs an optical circuit. A partial portion illustrated in FIG. 5 corresponds to a light emission side from the gates 106A to 106C of the optical system illustrated in FIG. 1.

It is noted that throughout the specification, the same reference numerals and letters refer to similar items in the figures, and thus once an item is defined in one figure, the description thereof may not be repeated.

In FIG. 5, optical waveguides 515(A, B, C), 516(A, B, C), and 517(A, B, C) are similar to each other in optical path length. Hereinafter, an example operation of the present exemplary embodiment is described below.

In the present exemplary embodiment, a light pulse extracted from the gate 106A can be guided into three branched optical waveguides 515A, 515B, and 515C. In the present exemplary embodiment, the gate 106A is operable as a switching element capable of controlling the light pulse to be introduced into each optical waveguide 515 (A, B, C).

More specifically, the gate 106A performs control for distributing the light into the optical waveguide 515A during the first repetitive frequency sweeping operation, into the optical waveguide 515B during the second sweeping operation, and into the optical waveguide 515C during the third sweeping operation in synchronization with the oscillation wavelength sweeping operation of the slave laser 150A.

Similarly, the gate 106B distributes the light into the optical waveguide 516C during the first sweeping operation, into the optical waveguide 516A during the second sweeping operation, and into the optical waveguide 516B during the third sweeping operation.

The gate 106C distributes the light into the optical waveguide 517B during the first sweeping operation, into the optical waveguide 517C during the second sweeping operation, and into the optical waveguide 517A during the third sweeping operation.

In the present exemplary embodiment, each multiplexing coupler 109(A, B, C) can generate a multiplexed light pulse whose central wavelength is swept with elapsed time. Therefore, an output from each multiplexing coupler can be directly used as a light source for an OCT apparatus.

Further, according to the present exemplary embodiment, the output from the above-described plurality of (three) multiplexing couplers (i.e., the light multiplexing units) can be used as a light source for a multi-beam type OCT apparatus configured to simultaneously irradiate a plurality of portions of a measurement target to be inspected with light beams.

Accordingly, employing the present exemplary embodiment including the above-described configuration can realize a high-speed OCT imaging system.

<4. An Embodiment Configured to Perform a Thinned-Out Sweeping Operation at a Reduced Rate of 1/N>

Figure 6:
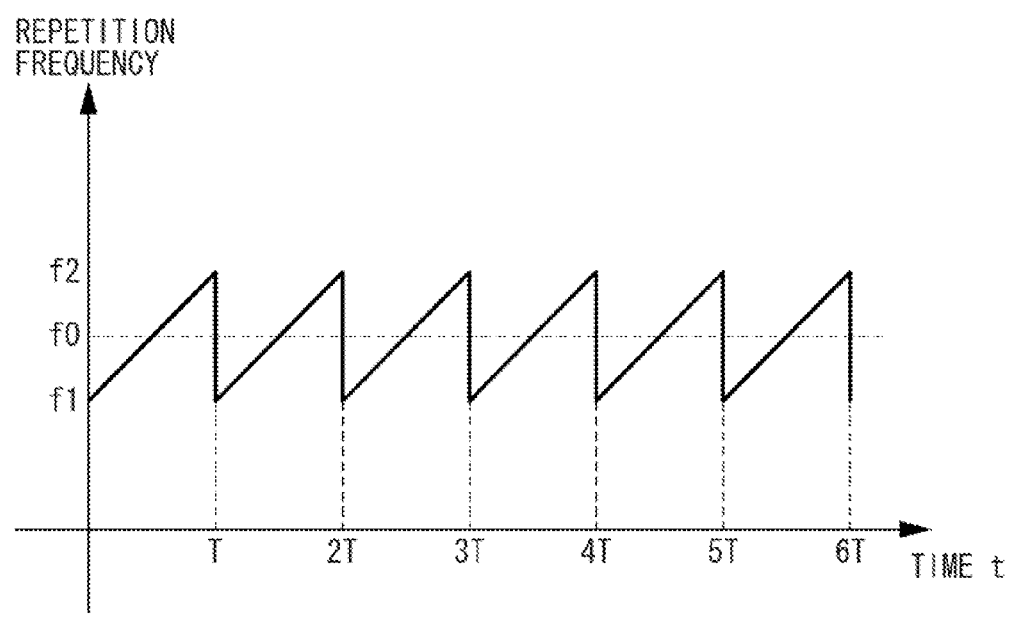
FIG. 6 illustrates a schematic example of wavelength sweep in an apparatus according to the present invention.
Figure 7:
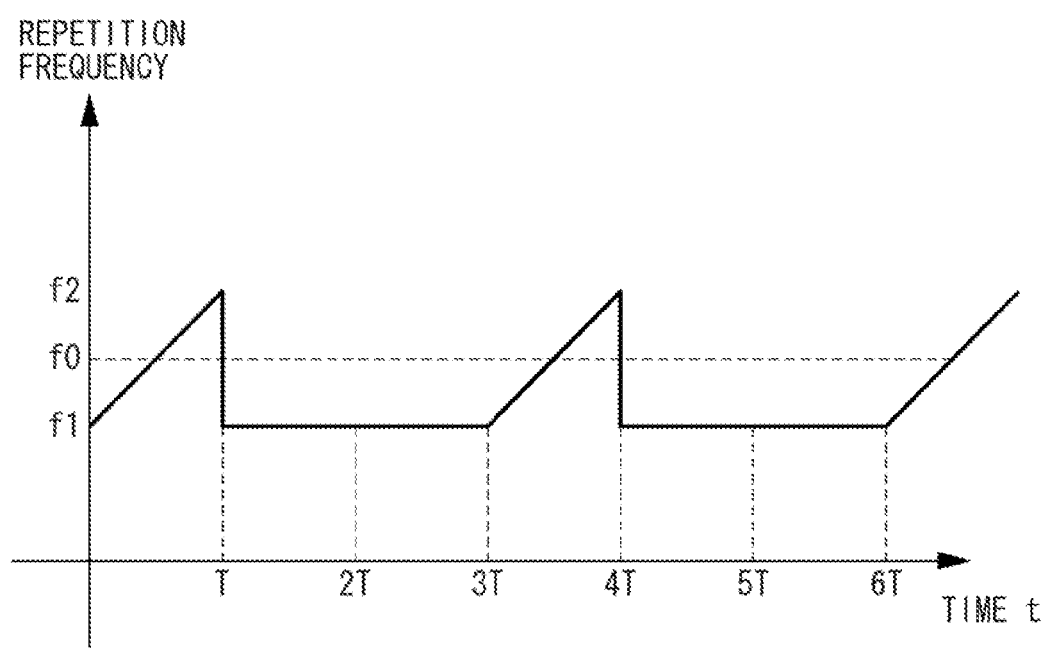
FIG. 7 illustrates a schematic example of wavelength sweep in an apparatus according to the present invention.

The method for sweeping the repetition frequency f0 in the pulse generation of the master laser is not limited to a method illustrated in FIG. 6 according to which the sweeping operation is continuously repeated at the interval T. For example, as illustrated in FIG. 7, the sweeping operation can be performed only one time during consecutive N T intervals (periods), in which N represents the total number of the slaves N. According to the example illustrated in FIG. 7, the total number of the slaves is equal to three (N=3) and therefore the wavelength sweeping operation is performed once every three periods.

Figure 8:
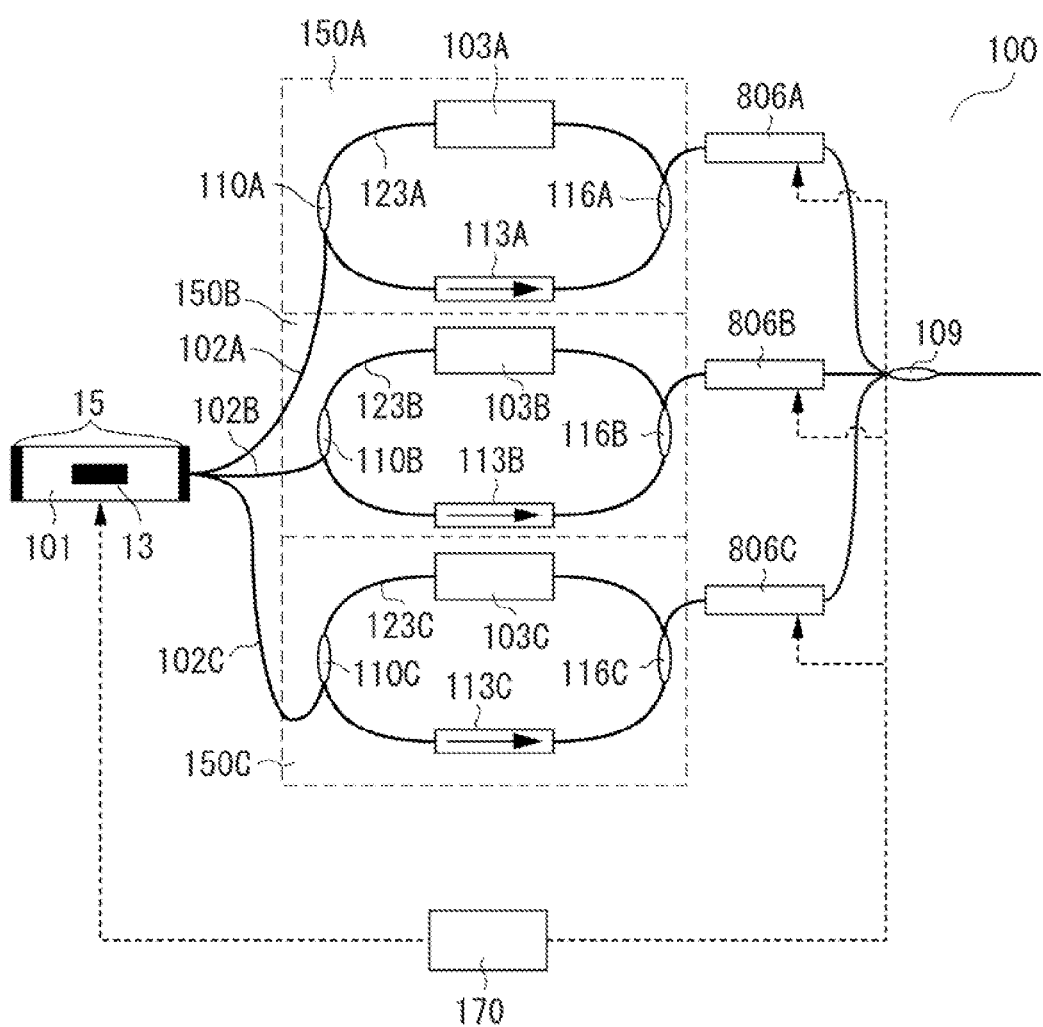
FIG. 8 illustrates a schematic example of an apparatus according to the present invention.

FIG. 8 illustrates a schematic example of an apparatus according to the present exemplary embodiment. The apparatus illustrated in FIG. 8 is mainly different from the apparatus illustrated in FIG. 1 in that the gates 106A, 106B, and 106C of the apparatus illustrated in FIG. 1 are replaced by delay mechanisms 806A, 806B, and 806C, respectively.

In the apparatus illustrated in FIG. 8, the length of an optical waveguide is differentiated in the region extending from respective output couplers 116A, 116B, and 116C to the multiplexing coupler 109.

For example, when T represents the time corresponding to the sweep period of the repetition frequency f0 in the master laser 101, it is desired that the following optical delay can be given by respective delay mechanisms 806A, 806B, and 806C. First, a light pulse from the output coupler 116A reaches the multiplexing coupler 109. Then, a light pulse from the output coupler 116B reaches the multiplexing coupler 109 with a delay time corresponding to T after the light pulse from the output coupler 116A has reached the multiplexing coupler 109. Further, a light pulse from the output coupler 116C reaches the multiplexing coupler 109 with a delay time corresponding to T after the light pulse from the output coupler 116B has reached the multiplexing coupler 109.

For example, respective delay mechanisms can use optical waveguides whose optical lengths are simply differentiated in increments of VgT, in which Vg represents a group refractive index. Alternatively, each delay mechanism can employ a delay line whose optical path length is variable.

The above-described delay mechanisms can be provided in intervenient paths extending from the master laser to respective slaves.

To realize the thinning operation according to the present exemplary embodiment, it is required to consider a propagation path via which a change of the repetition frequency in the master laser 101 propagates to an optical amplifier in each slave and a light pulse whose oscillation wavelength has been changed in each slave propagates to the multiplexing coupler 109 via an output coupler.

Considering the above condition, a sum of the optical path length from the master laser 101 to the optical amplifier 103(A, B, C) and the optical path length from the optical amplifier to the multiplexing coupler 109 is differentiated in respective slaves in increments of the above-described difference VgT.

Employing the optical system having the above-described configuration can make the configuration simple because no high-speed switching is required.

In the above-described configuration, for example, each slave can include an appropriate pulse stabilization mechanism, such as a saturable absorption member and an acoustic-optic modulator (AOM). In this case, stable pulse oscillations can be expected in respective slaves based on pulses injected from the master laser.

Further, output from the master laser or each slave laser can be deactivated in the time period in which the repetition frequency is not swept.

Accordingly, when the repetition frequency of pulses from the master laser is not swept, the above-described configuration can effectively prevent continuous wave (CW) light from oscillating due to an amplified spontaneous emission (ASE) component in each slave and also prevent ASE noise components from increasing. Thus, the apparatus according to the present exemplary embodiment can operate as a light source capable of suppressing noises.

<Members Constituting the Light Source Apparatus>

The laser oscillator including the first resonator according to the present invention can employ a laser light source capable of emitting pulsed light.

An example device capable of obtaining pulsed light is a laser that can perform a gain switching operation by control the gain or loss of the laser resonator to discharge stored energy or to perform a Q switching operation, or a mode locking laser that can fix the phase between respective modes in the multimode oscillation.

An example gain switching semiconductor laser is a semiconductor laser configured to rapidly obtain an oscillation state by superimposing a large-amplitude current pulse on a direct-current bias current whose level is lower than an oscillation threshold.

A mode locking semiconductor laser is not limited to the above-described active mode locking laser. For example, a passive mode locking laser including a saturable absorption member or a hybrid mode locking laser combining the active mode locking and the passive mode locking is employable.

The second optical resonator (i.e., the slave laser) according to the present invention is not limited to the above-described ring resonator. A linear resonator or a o-type resonator is employable. The ring resonator is not limited to a resonator using an optical fiber. For example, the ring resonator using the optical system enabling the light to propagate in the air or in the vacuum by a slab waveguide or a mirror is employable.

The linear resonator is, for example, an optical resonator including a pair of parallel surfaces (e.g., a Fabry-Perot resonator) or a linearly configured resonator including an optical fiber whose end surface is configured as a mirror.

An example apparatus that includes linear resonators is described below with reference to FIG. 14.

Figure 14:
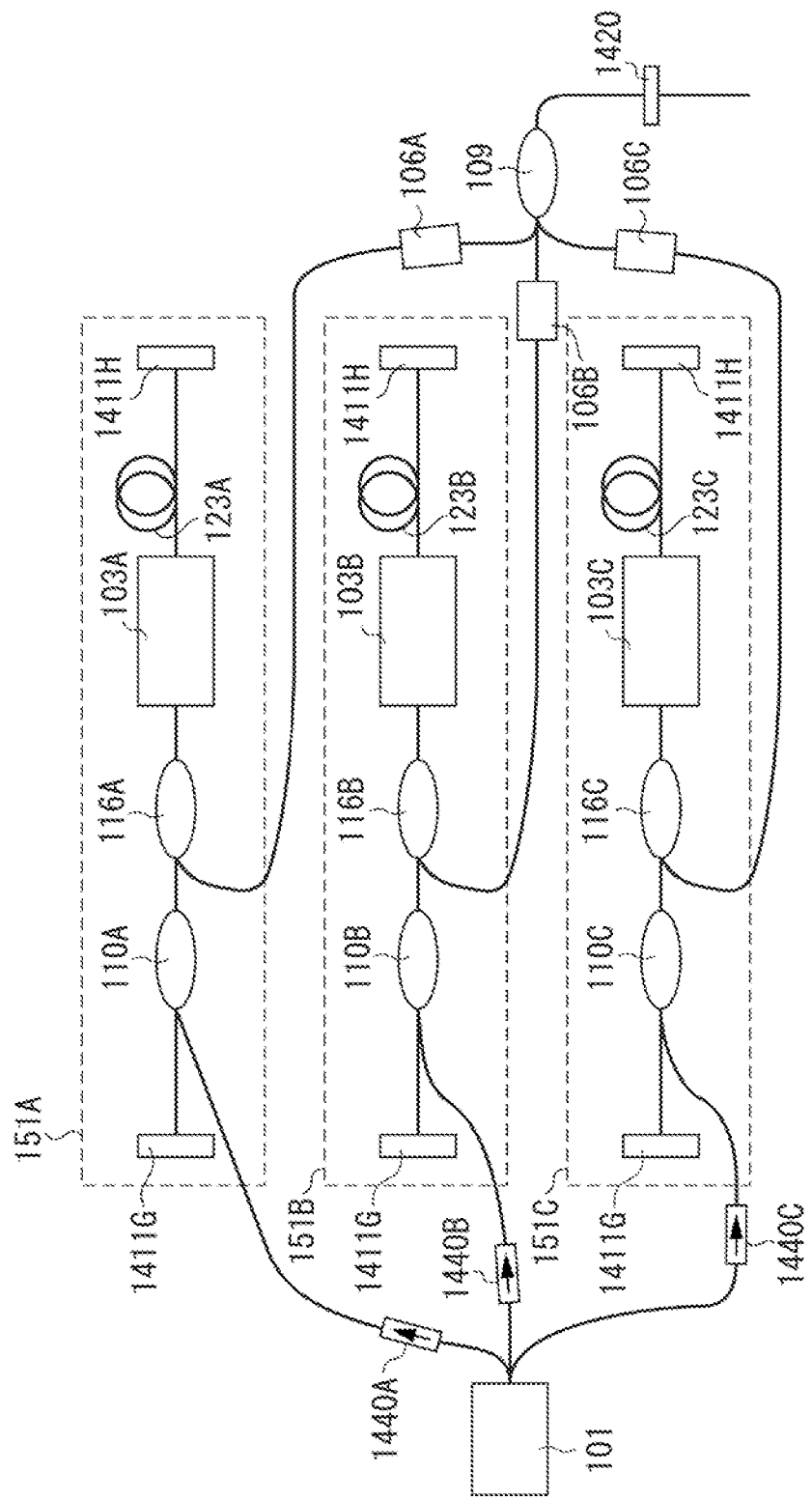
FIG. 14 illustrates a schematic example of an apparatus according to the present invention.

The apparatus illustrated in FIG. 14 is mainly different from the above-described apparatuses in that the ring resonators 150A, 150B, and 150C are replaced by linear resonators 151A, 151B, and 151C.

In FIG. 14, each slave resonator includes mirror termination fibers 1411G and 1411H disposed at both ends thereof. Each termination fiber includes a reflection mirror serving as a terminal portion of the optical fiber. An input coupler (110A, 110B, and 110C), an output coupler (116A, 116B, and 116C), an optical amplifier (103A, 103B, and 103C), and a refractive index dispersion fiber (123A, 123B, and 123C) are sequentially disposed between the reflection mirrors.

Light generated by each slave (151A, 151B, and 151C) is output via a light extraction unit (106A, 106B, and 106C) to the multiplexing coupler 109. The apparatus illustrated in FIG. 14 further includes an isolator (1440A, 1440B, and 1440C) coupled with each slave and an injection light cutoff filter 1420, as members that can be provided if necessary.

Although three resonators are provided in the above-described exemplary embodiments, the number of the second optical resonators (i.e., the slaves) is not limited to a specific value as long as two or more second optical resonators are provided. However, the size of a light source apparatus and the ease of control are factors to be taken into consideration. In this respect, it is desirable that the number of the second optical resonators is generally 2 or more but not more than 20. It is further desirable that the number of the second optical resonators is 3 or more but not more than 10. It is more desirable that the number of the second optical resonators is 3 or more but not more than 5.

An optical member to be disposed in each second optical resonator can be constituted by an optical fiber and an optical waveguide so as to have refractive index dispersion. In the present invention, a dispersion value of the refractive index dispersion of the optical member can be appropriately determined within a predetermined dispersion range from a negative (−) value to a positive (+) value considering an optical amplification medium to be employed, a sweep rate to be obtained, and a sweep wavelength range.

The optical amplification medium is not limited to a semiconductor optical amplifier (SOA) as described above. For example, the optical amplification medium can be a rare-earth additive (ion-doped) optical fiber containing erbium and neodymium. Further, the optical amplification medium can be a dye-doped optical fiber that can realize amplification by the dye.

The rare-earth additive optical fiber is preferable in that higher-gain and appropriate noise characteristics can be obtained. The dye-doped optical fiber is preferable in that variable wavelength selectivity can be enhanced by appropriately selecting a fluorescent dye material or its host material.

It is desirable that the semiconductor optical amplifier is compact and controllable at a higher speed. A resonator-type optical amplifier and a traveling waveform optical amplifier are examples usable as the semiconductor optical amplifier. A compound semiconductor that constitutes a general semiconductor laser is usable as a member constituting the semiconductor optical amplifier. For example, InGaAs, InAsP, GaAlSb, GaAsP, AlGaAs, and GaN compound semiconductors are usable. The semiconductor optical amplifier can be appropriately selected and employed considering the usage purpose of a light source. For example, a central wavelength of the gain can be selected from a group of 840 nm, 1060 nm, 1300 nm, and 1550 nm.

The input portions and the output portions of respective second optical resonators can be constituted by fiber couplers in a case where optical fibers are used for the resonators, or can be constituted by half mirrors in a case where members other than the optical fiber are used for the resonators.

The light extraction unit that extracts light from the output portion of each second optical resonator can be constituted by an optical modulator or an optical switch. In the above-described exemplary embodiments, an independent light extraction unit is provided for each slave. However, as a modified embodiment, a single light extraction unit that is commonly usable for a plurality of slaves can be provided.

A waveguide modulator capable of performing high-speed modulation is an example of the optical modulator. For example, an LN intensity modulator (equipped with a LiNbO3 substrate) using an electro-optic effect (Pockels effect) or an electro-absorption optical modulator (EA modulator) is employable. The LN intensity modulator includes an interferometer and can perform a light ON/OFF control based on a change in an interference state that can be obtained by changing the refractive index of one optical path. The LN intensity modulator is excellent in performing high-speed control.

The electro-absorption optical modulator is an intensity modulator operable based on a phenomenon that an absorption edge of the semiconductor shifts when an electric field is applied. The electro-absorption optical modulator is compact and operable at a lower voltage.

An optical path conversion switch for switching a light path and a gate switch for controlling ON/OFF of transmission of light are examples employable as the optical switch.

The optical path conversion switch is, for example, a 1*2 optical switch, a 1*3 optical switch, or 1*N switching device that includes a combination of a plurality of 1*2 branched waveguides.

The optical switch is roughly classified, according to its operation method, into a mechanical optical switch configured to mechanically switch the optical path, an electronic type optical switch configured to electrically switch the optical path, or an all-optical type optical switch configured to use light to switch the optical path. Any type of optical switch is usable. However, the electronic type optical switch and the all-optical type optical switch are preferable in that a high-speed operation can be realized.

The electronic type optical switch is, for example, an LN optical switch utilizing electro-optic effects, a magneto-optical type optical switch utilizing magneto-optical effects, or a switch using an acoustic-optic modulator, which utilizes acoustic-optic effects, as a gate. The LN optical switch is excellent in both an operation speed and an ON/OFF ratio.

The all-optical type optical switch can realize a very high speed (picoseconds or less) switching operation based on a light control utilizing nonlinear optical effects.

The light multiplexing unit configured to multiplex light pulses extracted from respective light extraction units can be constituted by an optical coupler. The optical coupler is roughly classified into a spatial type, an optical fiber type, or a planar waveguide type. A beam splitter (i.e., a half prism) is an example device usable as a spatial type optical coupler.

The optical fiber type coupler is, for example, an optical fiber coupler including an assembly of a plurality of optical fibers whose cores are adjacently disposed, or a multiplexer configured to multiplex a plurality of light beam signals into a composite signal to be output via a single optical fiber. The planar waveguide type coupler is, for example, a coupler formed on a substrate.

Hereinafter, the exemplary embodiments according to the present invention are described below in detail using specific examples.

Figure 9:
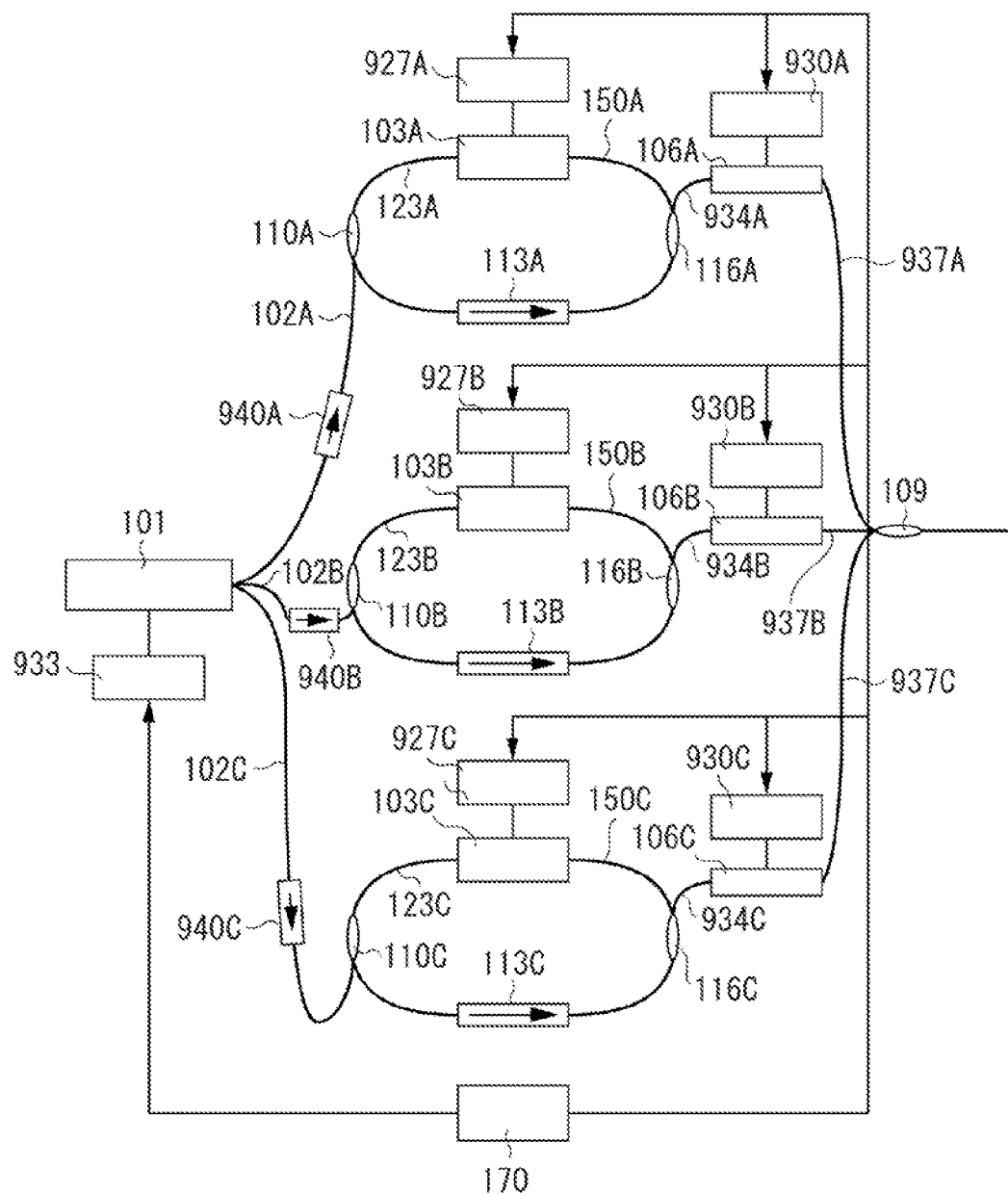
FIG. 9 illustrates a schematic example of an apparatus according to the present invention.

FIG. 9 illustrates a light source apparatus according to a first exemplary embodiment. The apparatus illustrated in FIG. 9 is similar to the apparatus illustrated in FIG. 1.

The light source apparatus illustrated in FIG. 9 includes a master laser 101 driven by a driving device 933 and a plurality of slave resonators 150A, 150B, and 150C that are optically coupled with the master laser 101.

In the present exemplary embodiment, the optical coupling can be realized by polarization maintaining fibers 102A, 102B, and 102C and input couplers 110A, 110B, and 110C. The polarization maintaining fibers 102A, 102B, and 102C can operate as introduction waveguides and have a length of 1 m. The input couplers 110A, 110B, and 110C are constructed by fiber couplers. The light source apparatus illustrated in FIG. 9 further includes isolators 940A, 940B, and 940C configured to prevent return light from each slave from entering the master laser 101 to stabilize an operation of the master laser 101.

Each slave resonator (150A, 150B, and 150C) includes a polarization maintaining fiber (having a transmission wavelength band of 1000 nm to 1100 nm) whose refractive index has wavelength dispersion so as to constitute a ring resonator. A resonator length of each slave resonator is set to be 100 m.

Each slave resonator (150A, 150B, and 150C) includes an isolator (113A, 113B, and 113C) and a semiconductor optical amplifier (103A, 103B, and 103C). The semiconductor optical amplifiers can be driven by respective driving devices (927A, 927B, and 927C).

Figure 10:
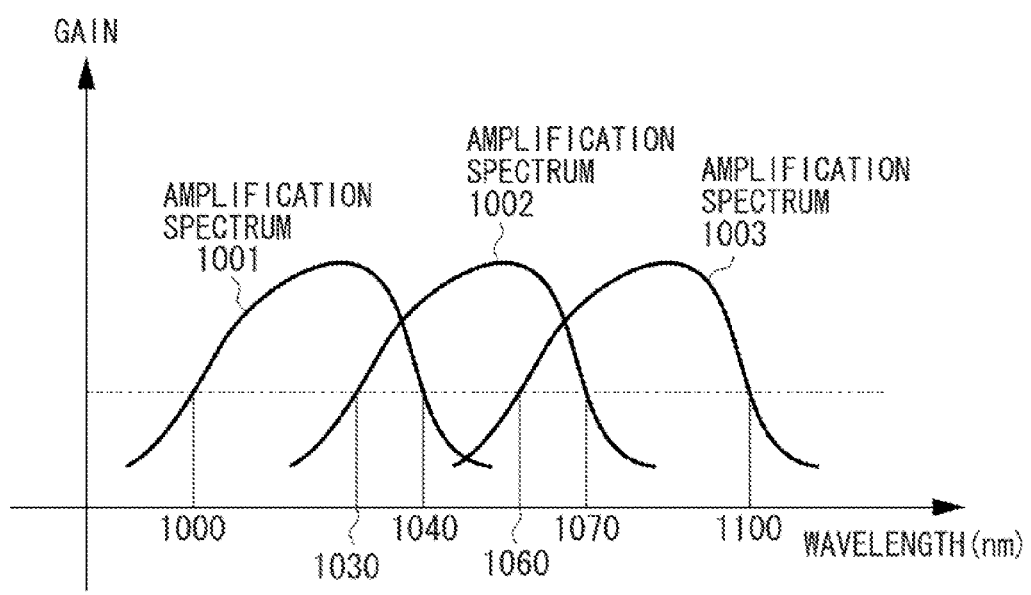
FIG. 10 is a graph illustrating example characteristics of optical amplifiers applicable to an apparatus according to the present invention.

Respective semiconductor optical amplifiers (103A, 103B, and 103C) have gain bands (amplification bands) that are partly overlapped with each other, as indicated by an amplification spectrum 1001, an amplification spectrum 1002, and an amplification spectrum 1003 in FIG. 10.

The optical amplifiers can be DC driven by the respective driving devices (927A, 927B, and 927C) so as to stabilize an amplification rate of the optical amplifier (103A, 103B, and 103C) in a state where no pulsed light is supplied from the master laser 101. More specifically, the driving device controls the temperature value and supplies an operation current (The driving device maintains the SOA temperature at a constant value and supplies a constant current).

A semiconductor laser capable of performing a gain switching operation is usable as the master laser 101.

More specifically, when the driving device 933 is activated, a voltage in which a direct-current component and an alternating-current component are superposed can be applied to the master laser 101. The master laser 101 emits an oscillating light pulse having a central wavelength of 980 nm and an oscillation repetition frequency of 1 GHz.

When the light pulse of 1 GHz is received, each of the optical amplifiers (103A, 103B, and 103C) performs gain modulation and a slave 920 causes the mode locking oscillation based on the dispersion tuning.

Figure 11:
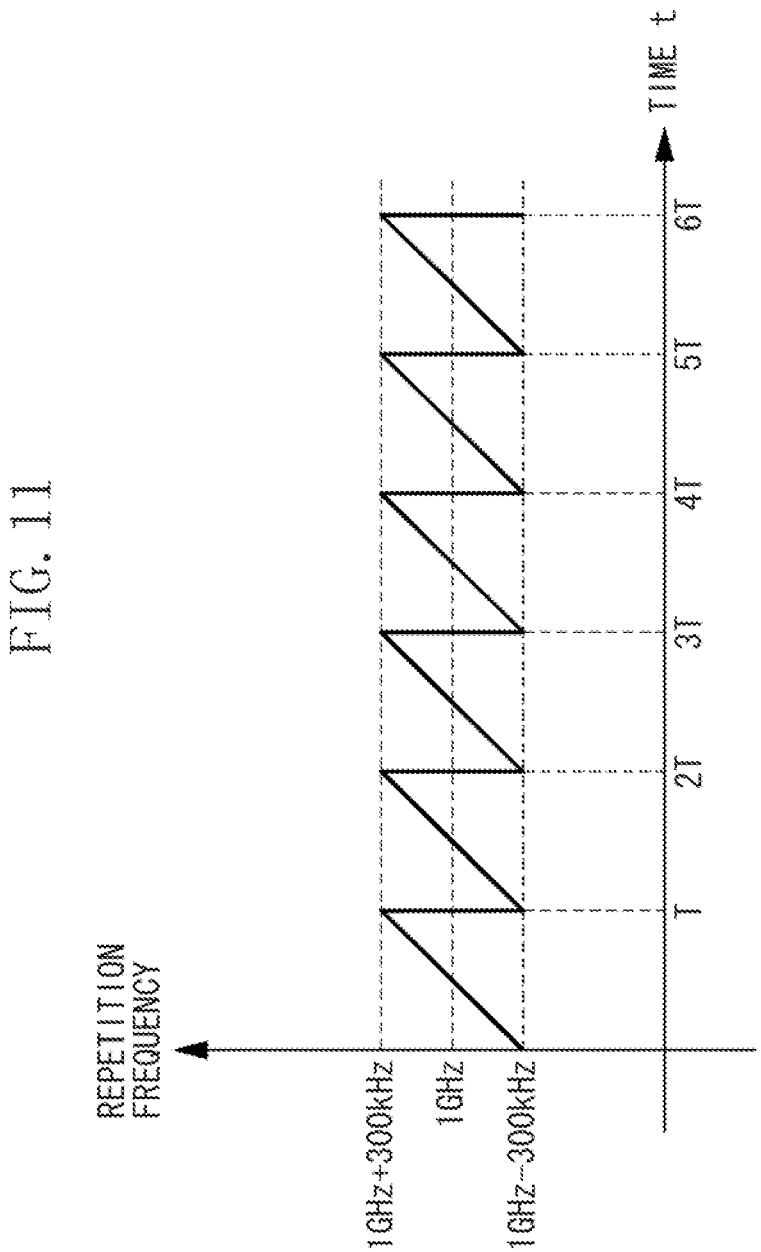
FIG. 11 illustrates a schematic example of wavelength sweep in an apparatus according to the present invention.

In this state, the repetition frequency of the master laser 101 is controlled so as to change in a range from (1 GHz−300 kHz) to (1 GHz+300 kHz), as illustrated in FIG. 11, at T periods of 1 millisecond.

As a result of the above-described control, each resonator generates pulsed light of approximately mW.

When each slave (150A, 150B, and 150C) receives a light pulse having the above-described repetition frequency from the master laser, each slave can generate a light pulse at a repetition frequency identical to that of the above-described master laser.

In the slave 105A, the oscillation wavelength is swept in a range from 1005 nm to 1035 nm in accordance with a frequency change of the master laser. Similarly, in the slave 105B, the oscillation wavelength is swept in a range from 1035 nm to 1065 nm. In the slave 105C, the oscillation wavelength is swept in a range from 1065 nm to 1095 nm.

The light pulse generated by each slave (150A, 150B, and 150C) is extracted via an associated output coupler (116A, 116B, and 116C).

Each output coupler is connected to an output waveguide (934A, 934B, and 934C), which is constituted by an optical fiber. The output waveguides are respectively connected to gates (106A, 106B, and 106C) which can be driven by respective driving devices (930A, 930B, and 930C).

In the present exemplary embodiment, the light gate can be constituted by an LN optical switch utilizing the electro-optic effects. The light gate shuts (OFF) or transmits (ON) the light pulse generated by each slave (150A, 150B, and 1500) in accordance with a drive signal supplied from the driving device (930A, 930B, and 930C).

The light source apparatus illustrated in FIG. 9 further includes a light source control unit 170 that controls the driving devices (927A, 927B, and 927C) connected to the semiconductor optical amplifiers, the driving devices (930A, 930B, and 903C) connected to the gates, and the driving device 933 connected to the master laser.

The light source control unit 170 includes a personal computer (PC), a signal generation source that generates a light source driving signal, a signal source that generates a drive signal to be supplied to an optical amplification medium of each slave, and a signal source that generates a gate driving signal which are connected with each other. The light source control unit 170 outputs a signal for designating the repetition frequency to the driving device 933. With the above-described operation, the oscillation wavelength of a light pulse oscillated from each slave is determined and the light source control unit 170 supplies a control signal to each driving device (930A, 930B, and 930C). The open/close state of each gate (106A, 106B, and 106C) is determined based on this signal.

In the present exemplary embodiment, each of the gates (106A, 106B, and 106C) is connected to the multiplexing coupler 109 via an optical fiber waveguide (937A, 937B, and 937C) having a length of 1 m. The multiplexing coupler 109 is constituted by an optical fiber coupler.

The light source control unit 170 supplies a control signal for pulse repetitive frequency sweeping to the driving device 933 connected to the master laser 101.

In response to the control signal, the gate driving device (930A, 930B, and 930C) is controlled in such a manner that only the gate 106A is opened and other gates 106B and 106C are closed in the first sweeping operation.

As a result, a light pulse having wavelengths ranging from 1005 nm to 1035 nm is successively output to the multiplexing coupler 109 constituted by an optical fiber coupler.

Subsequently, in the second sweeping operation of the pulse repetition frequency in the master laser 101, only the gate 106B is opened and the multiplexing coupler 109 outputs a light pulse generated by the slave laser 150B and having wavelengths ranging from 1035 nm to 1065 nm. Similarly, in the third sweeping operation of the pulse repetition frequency in the master laser 101, only the gate 106C is opened and the multiplexing coupler 109 successively outputs a light pulse having wavelengths ranging from 1065 nm to 1095 nm.

Thus, the multiplexing coupler 109 can successively output light pulses having the wavelength ranging from 1005 nm to 1095 nm. The sweep wavelength band obtained by the light source apparatus illustrated in FIG. 9 is broader compared to that of a light source apparatus including a general slave (a resonator).

As understood from the description of the present exemplary embodiment, the present invention can provide a wavelength sweep light source that is applicable in various ways by appropriately determining the number of the slaves and selecting the optical amplification media considering the purpose of use.

In the above-described examples, the wavelengths of light pulses oscillating in respective slaves are not overlapped with each other. However, according to another exemplary embodiment, a light source apparatus can be configured to generate light pulses whose wavelengths are overlapped with each other.

For example, the slave laser 150A can be configured to have an oscillation wavelength variable in a range from 1000 nm to 1040 nm. The slave laser 150B can be configured to have an oscillation wavelength variable in a range from 1030 nm to 1070 nm. The slave laser 150C can be configured to have an oscillation wavelength variable in a range from 1060 nm to 1100 nm.

In this case, for example, it is useful to insert a band-pass filter having a transmission wavelength in a range from 1005 nm to 1035 nm between the gate 106A and the multiplexing coupler 109. Similarly, it is useful to insert a band-pass filter having a transmission wavelength in a range from 1035 nm to 1065 nm between the gate 106B and the multiplexing coupler 109. Further, it is useful to insert a band-pass filter having a transmission wavelength in a range from 1065 nm to 1095 nm between the gate 106C and the multiplexing coupler 109.

As described above, by selecting the band-pass filters for respective slaves in such a manner that their wavelength bands are not overlapped with each other, the wavelengths of light pulses extracted from respective slaves can be continuously swept without causing any gap.

On the other hand, if a wavelength pulse corresponding to the lower part of the oscillation wavelength in each slave is cut by the band-pass filter, a light pulse train output from the multiplexing coupler 109 may include a blank time. More specifically, there is a slight blank time before the light pulse from the gate 106B reaches the multiplexing coupler 109 after the light pulse from the gate 106A has passed through the multiplexing coupler 109.

Hence, it is desired that the light source control unit 170 stores beforehand a relationship between the wavelength and arrival time of a pulse that reaches the multiplexing coupler 109. Alternatively, it is useful to set the optical fiber waveguide 937B to be shorter than the optical fiber waveguide 937A by an amount of the above-described blank time. Further, it is useful to set the optical fiber waveguide 937C to be shorter than the optical fiber waveguide 937B by an amount of the above-described blank time. In this case, the multiplexing coupler 109 can continuously output light pulses extracted during three repetitive frequency sweeping operations performed by the master laser.

Further, the length of each introduction waveguide (102A, 102B, and 103C) can be differentiated so as to change the optical path length from the master laser to the optical amplifier of each slave. Alternatively, an optical path length changing device or a delay line which can change a delay amount can be inserted into the introduction waveguide (102A, 102B, and 103C) or the multiplexing waveguide (937A, 937B, and 937C).

Further, if there is any time lag before the wavelength of a light pulse generated in each slave reaches a desired wavelength after a control signal is output from the light source control unit 170 to the driving device 933 of the master laser, it is useful to set a delay time between the output timing of a control signal supplied to the driving device 933 and the output timing of a control signal supplied to the driving device (930A, 930B, and 930C) of each gate (106A, 106B, and 106C).

Further, it is useful to provide an appropriate mechanism capable of monitoring the wavelength of a light pulse generated in each slave.

Further, as another embodiment, a part of light from each slave is extracted. The extracted light having passed through a narrow band-pass filter can be detected by a photo-detector to obtain a trigger signal usable to start a wavelength sweeping operation. More specifically, to realize the above-described operation, it is desired to use a band-pass filter that can transmit only a light pulse having a shortest wavelength or a longest wavelength among light pulses that can be generated by each of the slaves.

A light pulse can be extracted from each slave or shut off at desired timing by inputting the trigger signal to the control device (930A, 930B, and 930C) connected to each slave.

Figure 12:
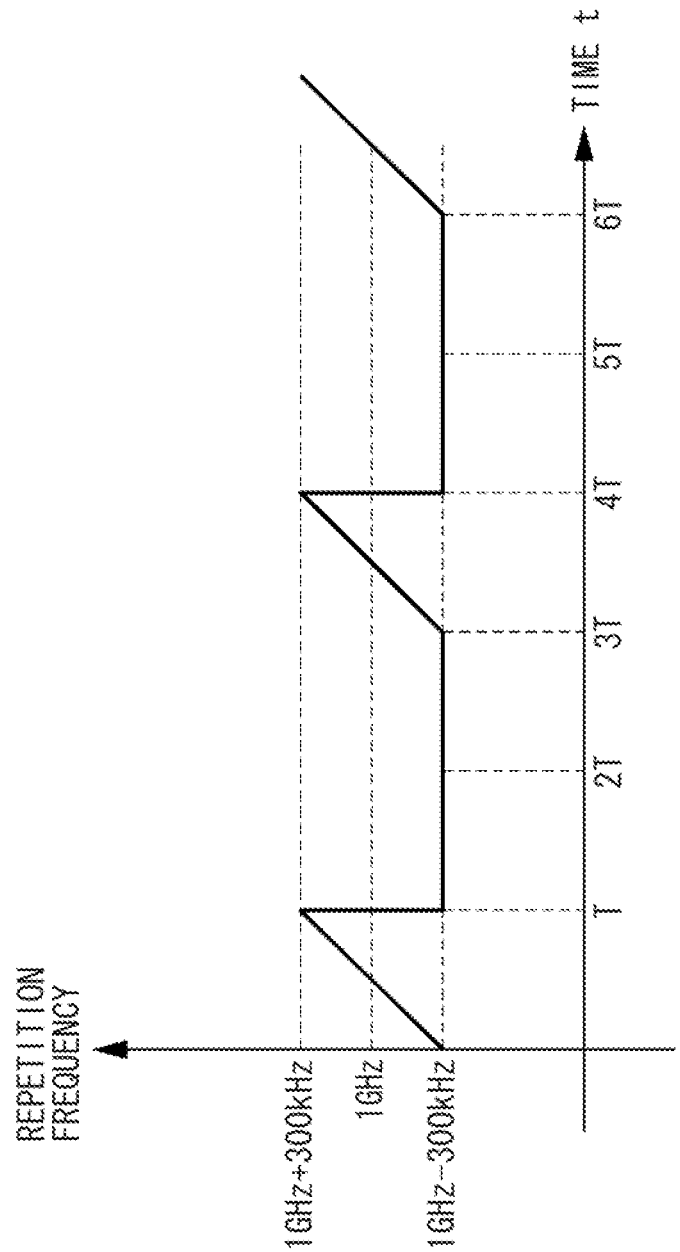
FIG. 12 illustrates a schematic example of wavelength sweep in an apparatus according to the present invention.

A modified example of the above-described first exemplary embodiment is described below. In a second exemplary embodiment, sweep timing illustrated in FIG. 12 is employed to drive the master laser 101 of the light source apparatus illustrated in FIG. 9. To change the repetition frequency of the master laser 101 in the range from (1 GHz−300 kHz) to (1 GHz+300 kHz) as illustrated in FIG. 12, the apparatus according to the second exemplary embodiment performs a (thinned-out) sweeping operation at the rate of once in three times, considering the number of the slaves (N=3), instead of continuously performing the repetitive sweeping operation.

In the present exemplary embodiment, the length of a multiplexing waveguide 937B and the length of a multiplexing waveguide 937A are set as follows.

The length of the multiplexing waveguide 937B is set to be longer than the length of the multiplexing waveguide 937A by an amount VgT, in which Vg represents a group speed with respect to the oscillation wavelength of pulsed light in the slave laser 150A and T represents a sweep period of the repetition frequency in the master laser. Similarly, the length of a multiplexing waveguide 937C is set to be longer than the length of the multiplexing waveguide 937B by the same amount VgT.

Thus, the multiplexing coupler 109 can successively receive light pulses having the wavelength ranging from 1005 nm to 1095 nm and output the received light pulse. In the above-described operation, the gate (106A, 106B, and 106C) is not an essential component. Therefore, the light source apparatus according to the present exemplary embodiment can reduce the number of requisite components as well as the cost required. Further, the light source apparatus according to the present exemplary embodiment can simplify an electric system because a high-speed control of the gate is not required.

Further, it is useful to employ an arrangement that can satisfy a condition that a sum of the optical distance from the master laser to each optical amplification medium and the optical distance from the optical amplification medium to the light multiplexing unit (i.e., the multiplexing coupler) is differentiated in respective resonators in increments of the above-described difference VgT.

An example of a wavelength sweep light source that can generate a plurality of light beams is described below with reference to FIG. 13.

Figure 13:
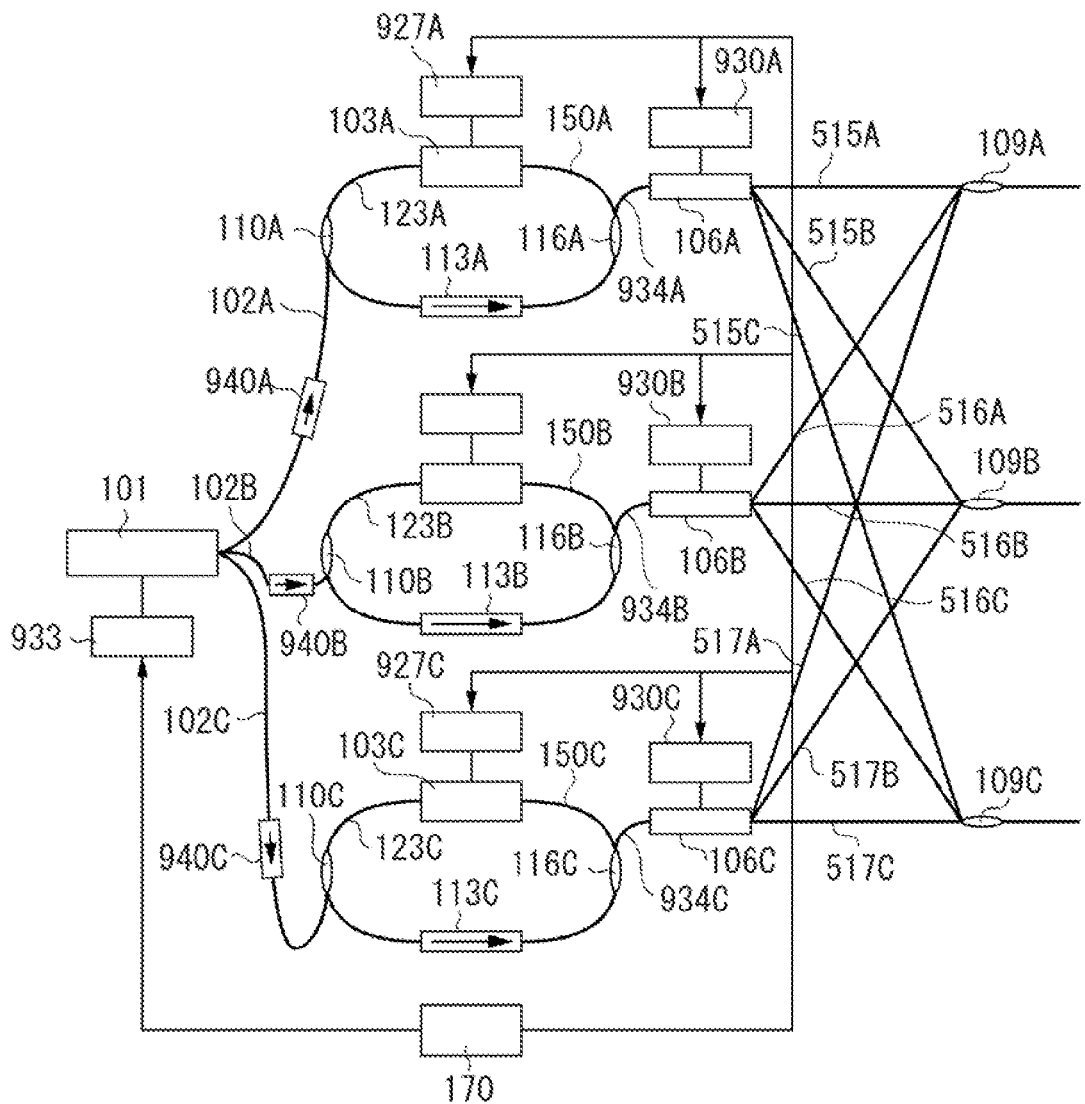
FIG. 13 illustrates a schematic example of an apparatus according to the present invention.

The light source apparatus according to a third exemplary embodiment illustrated in FIG. 13 includes a plurality of light multiplexing units. The apparatus illustrated in FIG. 13 is similar to the light source apparatus according to the first exemplary embodiment illustrated in FIG. 9, except that the multiplexing waveguides and the multiplexing coupler are modified.

In the apparatus illustrated in FIG. 13, the gate 106A is connected to three-branched optical waveguides 515A, 515B, and 515C, which are constituted by optical fibers. Similarly, the gate 106B is connected to three-branched optical waveguides 516A, 516B, and 516C. The gate 106C is connected to three-branched optical waveguides 517A, 517B, and 517C.

Three multiplexing couplers 109A, 109B, and 109C are constituted by optical fibers and connected to respective gates 106A, 106B, and 106C via the above-described three sets of optical waveguides 515(A, B, C), 516(A, B, C), and 517(A, B, C). In the present exemplary embodiment, the above-described three sets of optical waveguides 515, 156, and 517 are similar to each other in optical path length. Hereinafter, an example operation is described below.

The light pulse extracted by the gate 106A can be supplied to respective optical waveguides 515A, 515B, and 515C that are constituted by three branched optical fibers. In synchronization with the oscillation wavelength sweep in the slave laser 150A, the gate 106A performs control for distributing the light into the optical waveguide 515A during the first repetitive frequency sweeping operation, into the optical waveguide 515B during the second sweeping operation, and into the optical waveguide 515C during the third sweeping operation.

Similarly, the gate 106B distributes the light into the optical waveguide 516C during the first sweeping operation, into the optical waveguide 516A during the second sweeping operation, and into the optical waveguide 516B during the third sweeping operation.

The gate 106C distributes the light into the optical waveguide 517B during the first sweeping operation, into the optical waveguide 517C during the second sweeping operation, and into the optical waveguide 517A during the third sweeping operation.

In the above-described state, each multiplexing coupler 109(A, B, C) can generate a light pulse whose central wavelength is swept with elapsed time.

A basic operation of the apparatus according to the present exemplary embodiment is similar to the operation described in the first exemplary embodiment. More specifically, when the light source control unit 170 is activated, the master laser 101 generates a light pulse having a frequency of approximately 1 GHz.

The generated light pulse is supplied to the slave laser 150A, the slave laser 150B, and the slave laser 150C to enable each slave to perform a mode synchronizing operation (dispersion tuning).

More specifically, the slave laser 150A generates a light pulse having a wavelength in the range from 1005 nm to 1035 nm. The slave laser 150B generates a light pulse having a wavelength in the range from 1035 nm to 1065 nm. The slave laser 150C generates a light pulse having a wavelength in the range from 1065 nm to 1095 nm.

When the above-described gate operation is performed, the light output from each multiplexing coupler includes a plurality of light pulses whose wavelengths are successively arrayed in the range from 1005 nm to 1095 nm in terms of time.

The light source apparatus according to the present exemplary embodiment is employable as a light source for a multibeam OCT apparatus configured to emit a plurality of light beams.

An example of an optical tomographic imaging apparatus using a light source according to a fourth exemplary embodiment of the present invention is described below.

Figure 15:
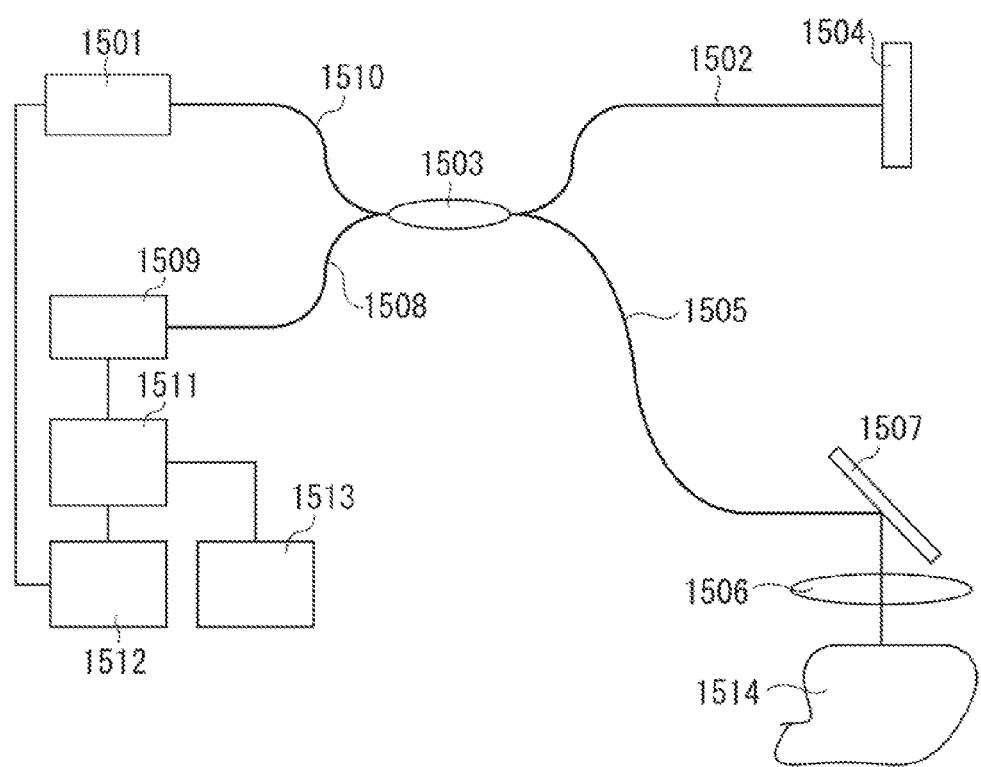
FIG. 15 illustrates a schematic example of an OCT apparatus that employs an apparatus according to the present invention.

FIG. 15 illustrates a schematic configuration of an OCT apparatus according to the present exemplary embodiment.

The OCT apparatus illustrated in FIG. 15 basically includes a light source unit (1501 etc.), and an inspection target measurement unit (1507 etc.) that can irradiate an inspection target with light emitted from the light source unit and transmit light reflected from the inspection target. The OCT apparatus further includes a reference unit (1502 etc.) that can irradiate a reference mirror with light and transmit light reflected from the reference mirror, and an interference unit (1503) that causes two reflection lights to interfere with each other. The OCT apparatus further includes a light detection unit (1509 etc.) that can detect the interference light obtained by the interference unit, and an image processing unit (1511) that can perform image processing (obtain a tomographic image) based on the light detected by the light detection unit. Hereinafter, each constituent component is described in more detail.

The light source unit includes a wavelength variable light source 1501 and a light source control unit 1512 that can control the wavelength variable light source 1501. The wavelength variable light source 1501 is connected to a fiber coupler 1503 via a light irradiation optical fiber 1510. The fiber coupler 1503 constitutes the interference unit.

The fiber coupler 1503 constituting the interference unit can be constituted by a single mode type in a wavelength band of the light source. Various fiber couplers are constituted by 3 dB couplers.

A reflection mirror 1504 is connected to a reference light optical path fiber 1502 to constitute the reference unit. The fiber 1502 is connected to the fiber coupler 1503.

An inspection light optical path fiber 1505, an irradiation condensing optical system 1506, and an irradiation position scanning mirror 1507 are members that cooperatively constitute a measurement unit. The inspection light optical path fiber 1505 is connected to the fiber coupler 1503. The fiber coupler 1503 outputs interference light as a result of interference between back scattering light generated from the inside or the surface of an inspection target 1514 and light returned from the reference unit.

The light detection unit includes a light receiving fiber 1508 and a photo-detector 1509. The light detection unit can guide the interference light generated by the fiber coupler 1503 to the photo-detector 1509.

The signal processing apparatus 1511 can convert the light received by the photo-detector 1509 into a spectral signal and can acquire depth information of the inspection target by applying Fourier transformation. The acquired depth information can be displayed on an image output monitor 1513 as a tomographic image.

In the present exemplary embodiment, the signal processing apparatus 1511 can be constituted by a personal computer. The image output monitor 1513 can be configured by a display screen of the personal computer.

As a characteristic feature of the light source unit according to the present exemplary embodiment, the light source control unit 1512 controls the oscillation wavelength and intensity as well as their temporal changes of the wavelength variable light source 1501.

The light source control unit 1512 is connected to the signal processing apparatus 1511 that can control a drive signal to be supplied to the irradiation position scanning mirror 1507. The light source control unit 1512 controls the wavelength variable light source 1501 in synchronization with the driving control of the scanning mirror 1507.

For example, if the light source apparatus described in the first exemplary embodiment is employed as the wavelength variable light source 1501 in the present exemplary embodiment, the light source apparatus can speedily sweep the wavelength in a broad band. Therefore, the present exemplary embodiment can acquire tomographic image information whose resolution is high in the depth direction. The OCT apparatus according to the present exemplary embodiment can be used for a tomographic image capturing operation in the medical field (e.g., ophthalmologic, dental, and dermatologic examinations).

Figure 16:
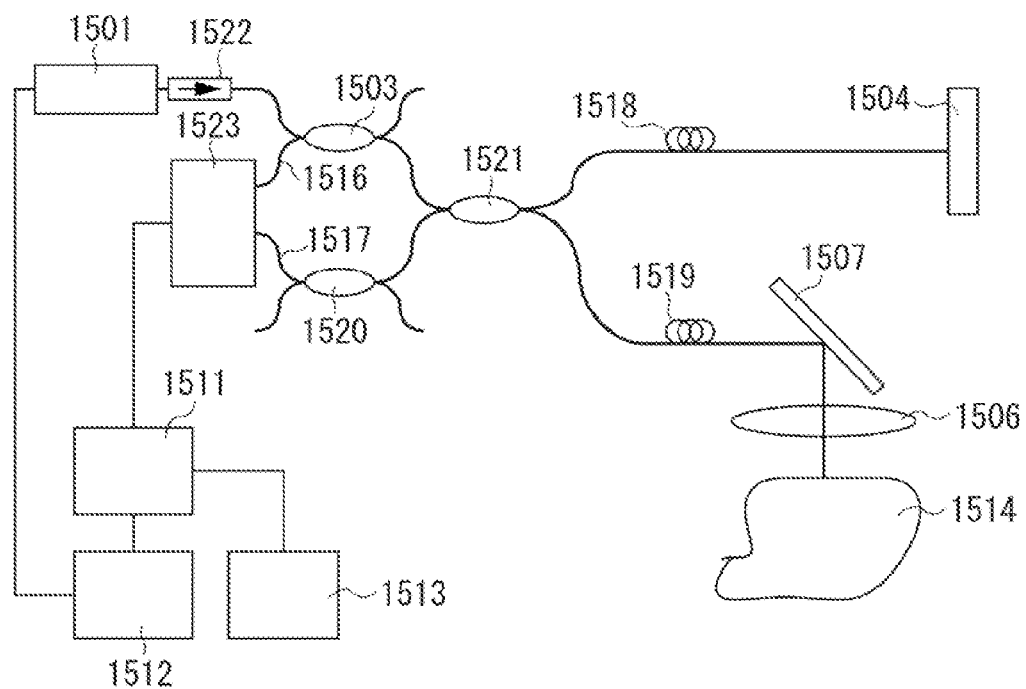
FIG. 16 illustrates a schematic example of an OCT apparatus that employs an apparatus according to the present invention.

An example of an optical tomographic imaging apparatus according to a fifth exemplary embodiment that includes an optical system configured to differentially detect an interference signal, is described below. FIG. 16 schematically illustrates an optical tomographic imaging apparatus according to the present exemplary embodiment. Components similar to those of the apparatus illustrated in FIG. 15 are denoted by the same reference numerals.

The apparatus illustrated in FIG. 16 is mainly different from the apparatus illustrated in FIG. 1 in that the photo-detector 1509 illustrated in FIG. 15 is replaced by a balance photo-detector 1523 and fiber couplers 1503 and 1520. The balance photo-detector 1523 is functionally operable as a light detector and a differential amplifier.

The balance photo-detector 1523 is connected to a signal processing unit 1511 at one end, and has two terminals at the other end. One of two terminals is connected to the optical coupler 1503 via a fiber 1516. The other terminal is connected to the optical coupler 1505 via a fiber 1517 and the optical coupler 1520.

The apparatus according to the present exemplary embodiment, which has the above-described configuration, is configured to divide an interference signal based on the reflection light from the inspection target 1514 and the refection light from the reference mirror 1504 and detect a difference between the divided signals.

When the light is divided into two light components before it reaches the balance photo-detector 1523, two divided interference signals become opposite in phase. Therefore, a DC component included in the original signal before the division can be removed by reducing one of the divided interference signals from the other. Thus, the apparatus according to the present exemplary embodiment can extract only the interference component.

The apparatus illustrated in FIG. 16 further includes an isolator 1522 and polarization controllers 1518 and 1519.

Further, it is useful to successively monitor the intensity of light emitted from the light source 1501 and correct the amplitude of the interference signal based on monitoring data.

A sixth exemplary embodiment which is an OCT apparatus including the wavelength sweep light source (i.e., the multi-beam light source) capable of generating a plurality of light beams described in the third exemplary embodiment is described below with reference to FIG. 17.

Figure 17:
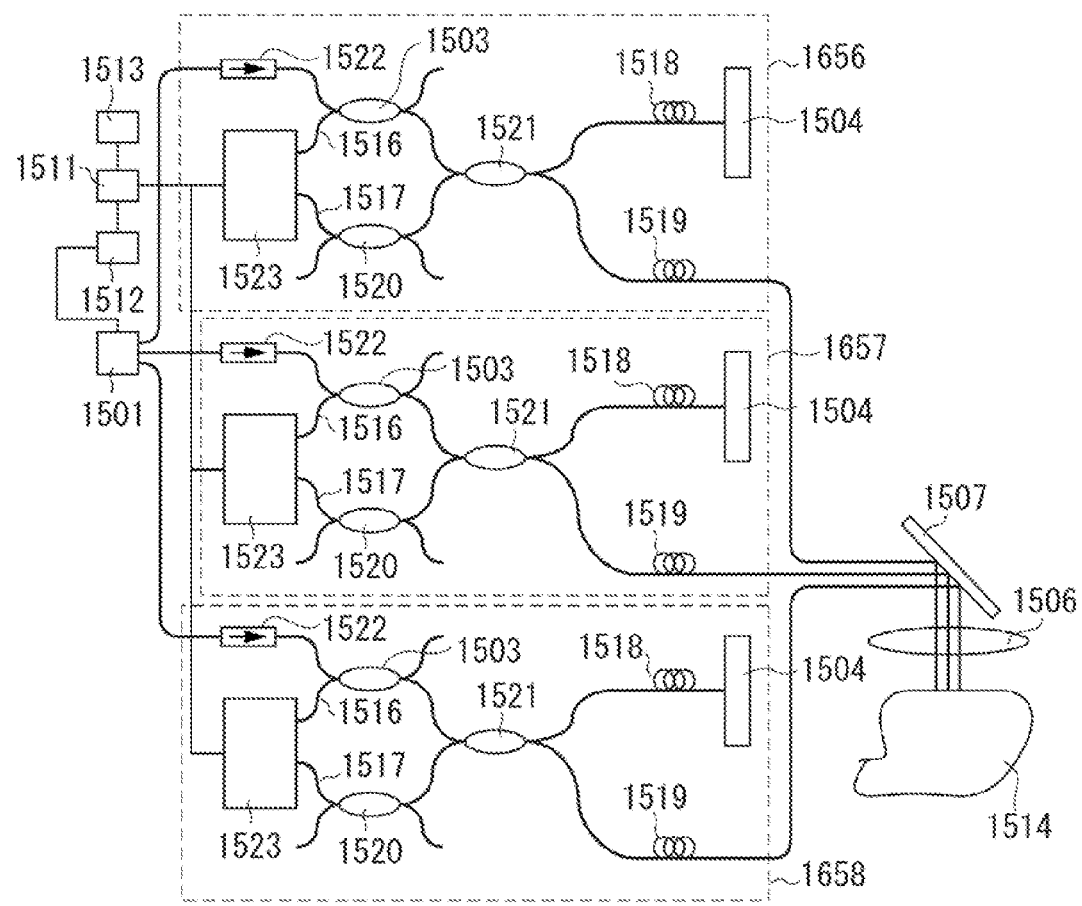
FIG. 17 illustrates a schematic example of an OCT apparatus that employs a light source apparatus according to the present invention.

An apparatus illustrated in FIG. 17 includes three interference systems 1656, 1657, and 1658. Each interference system has a configuration similar to that of the apparatus described in the fifth exemplary embodiment (see FIG. 16). Hence, constituent components similar to those described in FIG. 16 are denoted by the same reference numerals and their detailed descriptions are not repeated.

The present exemplary embodiment is characterized in that the light source apparatus described in the third exemplary embodiment is applied to a light source unit 1501. The light source unit 1501 emits three light beams which are supplied to respective interference systems via isolators 1522.

In the present exemplary embodiment, multi-beams can be extracted as parallel light beams from a fiber bundle and an inspection target 1514 can be irradiated with the extracted parallel light beams. Thus, simultaneously measuring a plurality of portions of the measurement target 1514 based on interference measurement becomes feasible. In other words, according to the present exemplary embodiment, a tomographic imaging apparatus which can perform a high-speed measurement operation is realized.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-133293 filed Jun. 10, 2010, which is hereby incorporated by reference herein in its entirety.

What is claimed is:

1. A light source apparatus comprising:
a laser oscillator configured to emit pulsed light, the laser oscillator equipped with a first optical resonator and a plurality of second optical resonators, the plurality of second optical resonators being arranged in parallel to each other and including input portions respectively connected to the first optical resonator;
a light multiplexing unit configured to multiplex the pulsed light emitted from an output portion of each second optical resonator; and
a light source control unit configured to change a repetition frequency of the pulsed light,
wherein the light source apparatus sweeps the wavelength of the pulsed light which is multiplexed by the light multiplexing unit,
an optical member having refractive index dispersion and an optical amplification medium are disposed in each of the plurality of second optical resonators, and the optical amplification media of the plurality of second optical resonators are different from each other in maximum gain wavelength,
wherein the light source control unit changes the repetition frequency of the pulsed light to cause the light source apparatus to sweep the wavelength of the emitted pulsed light.

2. The light source apparatus according to claim 1, wherein pulsed light is introduced into the plurality of second optical resonators from the laser oscillator.

3. The light source apparatus according to claim 2, wherein the introduced pulsed light causes cross gain modulation in the optical amplification medium.

4. The light source apparatus according to claim 2, wherein the introduced pulsed light causes mode locking in the second optical resonators.

5. The light source apparatus according to claim 3, wherein if a repetition frequency of the pulsed light is changed, a mode locking state is changed in each second optical resonator and a wavelength of pulsed light generated in the resonator is changed.

6. The light source apparatus according to claim 2, wherein the wavelength of the pulsed light is equal to or shorter than a wavelength of an amplification band of the optical amplification medium disposed in the second optical resonator.

7. The light source apparatus according to claim 1, wherein a gain band in each of the plurality of optical amplification media is partly overlapped with each other.

8. The light source apparatus according to claim 1, wherein a free spectral range in each of the plurality of second optical resonators is equal to each other.

9. The light source apparatus according to claim 1, wherein frequency dependency of a free spectral range of each second optical resonator can be defined by Formula 1 and takes a same value in each second optical resonator, where Formula 1 is given as:

$$\frac{dFSR(v)}{dv} = \left(\frac{d\left(\frac{c}{n(v) \times L}\right)}{dv}\right)$$

where v represents the frequency of light being used, L represents a resonator length, and n(v) represents a refractive index of the medium in each second optical resonator.

10. The light source apparatus according to claim 1, wherein the optical amplification medium in the second optical resonator is a semiconductor optical amplifier.

11. The light source apparatus according to claim 1, wherein the second optical resonators are mutually similar in a sum of an optical distance from the laser oscillator to the optical amplification medium and an optical distance from the optical amplification medium to the light multiplexing unit.

12. The light source apparatus according to claim 1, wherein, in each of the second optical resonators, a sum of an optical distance from the laser oscillator to the optical amplification medium and an optical distance from the optical amplification medium to the light multiplexing unit is differentiated in respective resonators in increments of VgT, wherein, Vg represents a group speed with respect to oscillation wavelength of pulsed light in the resonator, and T represents a repetition frequency sweep period of the laser oscillator.

13. The light source apparatus according to claim 1, wherein the light multiplexing unit successively outputs pulses of light generated by the plurality of second optical resonators.

14. The light source apparatus according to claim 1, wherein the light source apparatus includes a plurality of the light multiplexing units configured to output a plurality of light beams.

15. An optical tomographic imaging apparatus comprising:
a light source apparatus defined in claim 1;
an inspection target measurement unit configured to irradiate an inspection target with a light beam output from the light source apparatus and transmit reflection light from the inspection target;
a reference unit configured to irradiate a reference mirror with the light beam output from the light source apparatus and transmit reflection light from the reference minor;

an interference unit configured to cause the reflection light transmitted from the inspection target measurement unit to interfere with the reflection light transmitted from the reference unit;

a light detection unit configured to detect interference light obtained by the interference unit; and an image processing unit configured to obtain a tomographic image of the inspection target based on the interference light detected by the light detection unit.

16. The light source apparatus according to claim 1, wherein the light source apparatus further comprises a plurality of gate units each disposed between a different one of the plurality of second optical resonators and the light multiplexing unit, and wherein the light emitted from the output portion of each second optical resonator is multiplexed through each gate unit.

17. The light source apparatus according to claim 16, wherein the light source control unit controls the gate units to be in a state in which light passes through the plurality of gate units or to be in a state in which light does not pass through the plurality of gate units.

* * * * *